(12) United States Patent
Baek et al.

(10) Patent No.: US 11,145,672 B2
(45) Date of Patent: Oct. 12, 2021

(54) SEMICONDUCTOR DEVICE INCLUDING STACK STRUCTURES HAVING GATE PADS WITH DIFFERENT THICKNESSES

(71) Applicant: Samsung Electronics Co., Ltd., Suwon-si (KR)

(72) Inventors: Seok Cheon Baek, Hwaseong-si (KR); Boh Chang Kim, Hwaseong-si (KR); Chung Ki Min, Hwaseong-si (KR); Ji Hoon Park, Hwaseong-si (KR); Byung Kwan You, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/706,684

(22) Filed: Dec. 7, 2019

(65) Prior Publication Data

US 2020/0119044 A1    Apr. 16, 2020

Related U.S. Application Data

(63) Continuation of application No. 16/136,474, filed on Sep. 20, 2018, now Pat. No. 10,535,679.

(30) Foreign Application Priority Data

Mar. 28, 2018   (KR) .................. 10-2018-0035781

(51) Int. Cl.
*H01L 27/11582*    (2017.01)
*H01L 23/00*    (2006.01)
*H01L 29/423*    (2006.01)
*H01L 27/11565*    (2017.01)
*H01L 27/11548*    (2017.01)
(Continued)

(52) U.S. Cl.
CPC ........ *H01L 27/11582* (2013.01); *H01L 24/05* (2013.01); *H01L 24/08* (2013.01); *H01L 24/48* (2013.01); *H01L 24/69* (2013.01); *H01L 27/11531* (2013.01); *H01L 29/4234* (2013.01)

(58) Field of Classification Search
CPC ............. H01L 27/115; H01L 27/11524; H01L 27/11529; H01L 27/11531; H01L 27/11548–11556; H01L 27/11563–11582; H01L 29/4234; H01L 24/02–09; H01L 2224/03001; H01L 24/48; H01L 24/64–70
See application file for complete search history.

(56) References Cited

U.S. PATENT DOCUMENTS 8,013,389 B2    9/2011    Oh et al.
9,000,508 B2    4/2015    Lee et al.
(Continued)

*Primary Examiner* — Sonya McCall-Shepard
(74) *Attorney, Agent, or Firm* — Muir Patent Law, PLLC

(57) ABSTRACT

A semiconductor device includes lower gate electrodes placed on a substrate and spaced apart from one another; upper gate electrodes placed over the lower gate electrodes and spaced apart from one another; an R-type pad extending from one end of at least one electrode among the lower gate electrodes or the upper gate electrodes and having a greater thickness than the lower gate electrode or upper gate electrode connected to the R-type pad; and a P-type pad extending from one end of at least one electrode to which the R-type pad is not connected among the lower gate electrodes or the upper gate electrodes and having a different thickness than the R-type pad, wherein the P-type pad includes a first pad connected to an uppermost lower gate electrode among the lower gate electrodes.

19 Claims, 15 Drawing Sheets

(51) Int. Cl.
*H01L 27/11575* (2017.01)
*H01L 27/11556* (2017.01)
*H01L 27/1157* (2017.01)
*H01L 21/768* (2006.01)
*H01L 23/538* (2006.01)
*H01L 27/11531* (2017.01)

(56) References Cited

U.S. PATENT DOCUMENTS

| | | |
|---|---|---|
| 9,018,696 B2 | 4/2015 | Wada et al. |
| 9,281,217 B1 | 3/2016 | Jung et al. |
| 9,576,967 B1 | 2/2017 | Kimura et al. |
| 9,698,153 B2 | 7/2017 | Liu et al. |
| 9,953,999 B2 | 4/2018 | Nam et al. |
| 2015/0179564 A1 | 6/2015 | Lee et al. |
| 2015/0287710 A1 | 10/2015 | Yun et al. |
| 2016/0268303 A1 | 9/2016 | Kawai et al. |

… (1)

SEMICONDUCTOR DEVICE INCLUDING STACK STRUCTURES HAVING GATE PADS WITH DIFFERENT THICKNESSES

CROSS-REFERENCE TO THE RELATED APPLICATION

This U.S. non-provisional patent application is a continuation of U.S. patent application Ser. No. 16/136,474, filed Sep. 20, 2018, in the U.S. Patent and Trademark Office, which claims the benefit of priority from Korean Patent Application No. 10-2018-0035781, filed Mar. 28, 2018, in the Korean Intellectual Property Office, the disclosures of both of which are incorporated herein by reference in their entireties.

BACKGROUND

1. Field

Apparatuses and methods consistent with example embodiments relate to a semiconductor device including a stack structure and, more particularly, to a semiconductor memory device having a plurality of stack structures.

2. Description of Related Art

A technique using a stack structure in which insulating layers and electrode layers are alternately and repeatedly stacked on a substrate has been attempted in order to increase the degree of integration of semiconductor elements along with making electronic apparatuses including semiconductor devices light, thin, short, and small.

It is possible to vertically stack more insulating layers and electrode layers in order to increase the capacity of a semiconductor device, but it is necessary to secure electrical and mechanical reliability of the semiconductor device when doing so.

SUMMARY

The example embodiments are directed to improving reliability of operating characteristics of a semiconductor device having a single stack, a double-stack, or a multi-stack structure.

According to certain example embodiments, the disclosure is directed to a semiconductor device comprising: lower gate electrodes placed on a substrate and spaced apart from one another in a vertical direction; upper gate electrodes placed over the lower gate electrodes and spaced apart from one another in the vertical direction; an R-type pad extending from one end of at least one electrode among the lower gate electrodes or the upper gate electrodes and having a greater thickness than that of the lower gate electrode or upper gate electrode connected to the R-type pad; and a P-type pad extending from one end of at least one electrode to which the R-type pad is not connected among the lower gate electrodes or the upper gate electrodes and having a different thickness than the R-type pad, wherein the P-type pad comprises a first pad connected to an uppermost lower gate electrode among the lower gate electrodes.

According to certain example embodiments, the disclosure is directed to a semiconductor device comprising: a lower stack structure comprising lower gate electrodes and lower insulating layers alternately stacked on a substrate; an upper stack structure comprising upper gate electrodes and upper insulating layers alternately stacked on the lower stack structure; at least one dummy word line spaced apart from the lower gate electrodes and the upper gate electrodes in a vertical direction; a channel structure passing though the lower stack structure, the upper stack structure, and the dummy word line in the vertical direction; an R-type pad extending from one end of each of the lower gate electrodes and the upper gate electrodes in a horizontal direction and having a greater thickness than the lower gate electrode or upper gate electrode connected to the R-type pad; a P-type pad extending from one end of the dummy word line in the horizontal direction and having the same thickness as the dummy word line connected to the P-type pad; an R-type contact connected to the R-type pad in the vertical direction; a P-type contact connected to the P-type pad in the vertical direction; and a coupling wire commonly connected to the R-type contact and the P-type contact.

According to certain example embodiments, the disclosure is directed to a semiconductor device comprising: gate electrodes placed on a substrate and spaced apart from one another in a first direction perpendicular to a second direction; insulating layers stacked alternately with the gate electrodes; an R-type pad extending in the second direction from one end of at least one gate electrode among the gate electrodes and having a greater thickness than the gate electrode connected to the R-type pad; a P-type pad extending in the second direction from one end of at least one gate electrode to which the R-type pad is not connected among the gate electrodes and having a different thickness than the R-type pad; a lower interlayer insulating layer covering a first portion of an upper surface of the R-type pad and contacting an upper surface of the substrate; an upper interlayer insulating layer covering a second portion of the upper surface of the R-type pad and formed on the lower interlayer insulating layer; and a channel structure vertically passing through the gate electrodes and the insulating layers.

DETAILED DESCRIPTION

Figure 1:
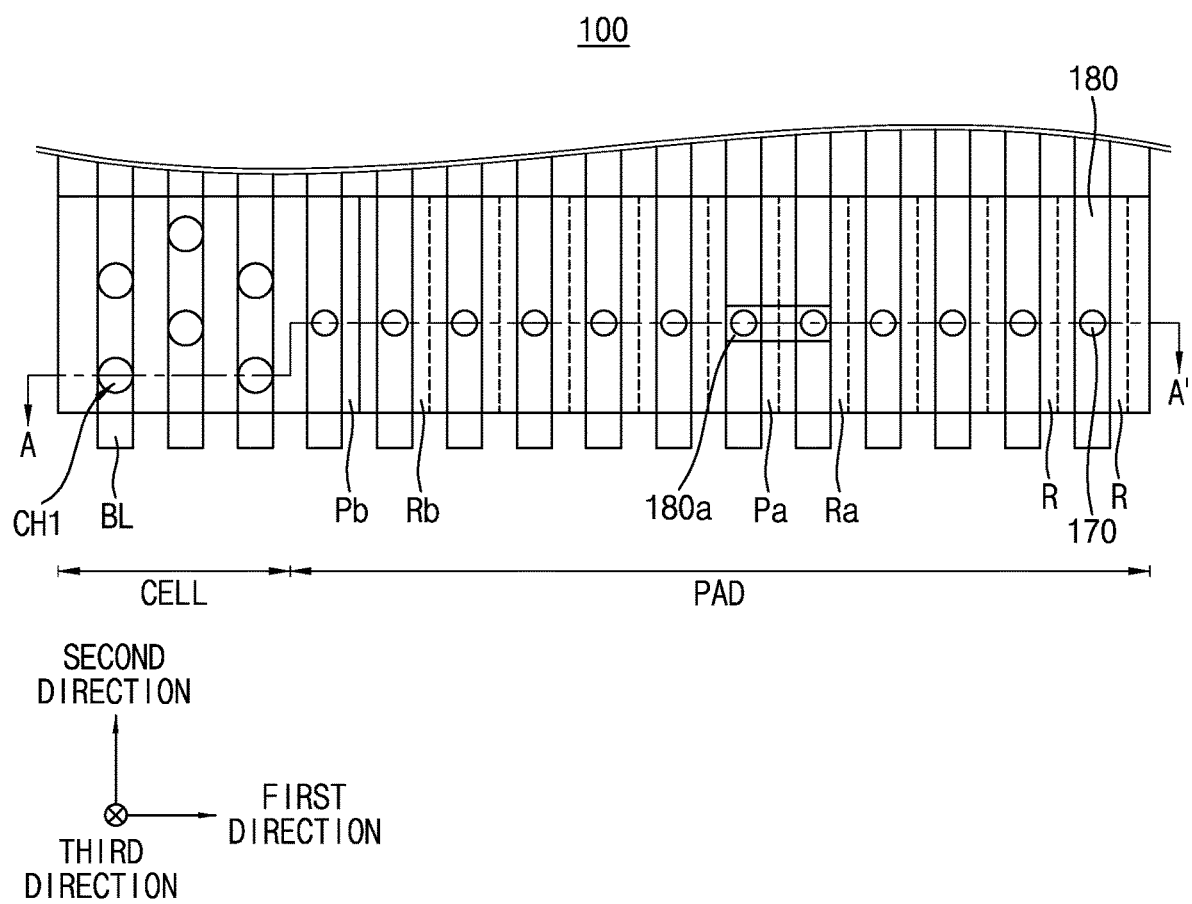
FIG. 1 is a schematic layout of some regions of a semiconductor device according to an example embodiment.
Figure 2:
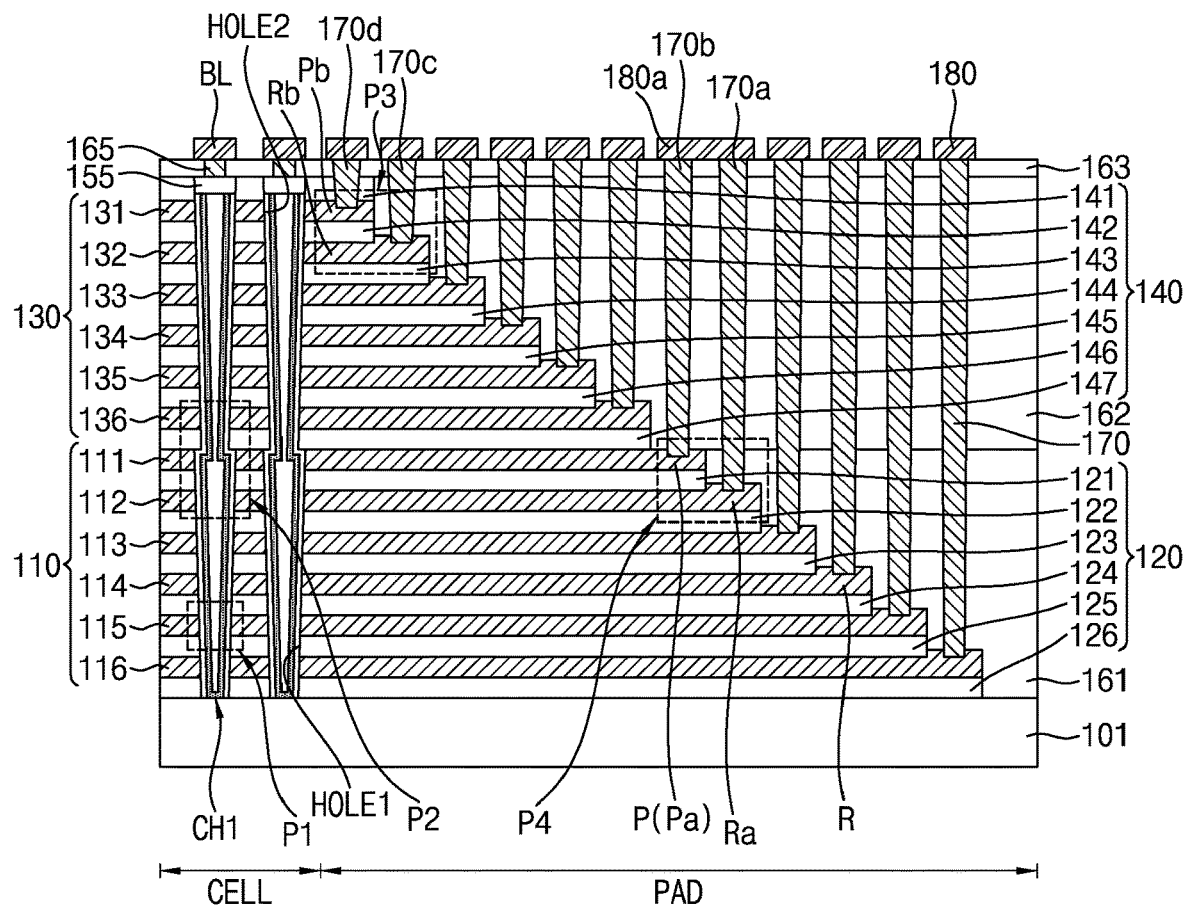
FIG. 2 is a vertical sectional view taken along A-A' of FIG. 1.

FIG. 1 is a schematic layout of some regions of a semiconductor device according to an example embodiment. FIG. 2 is a vertical sectional view taken along A-A' of FIG.

Figure 3:
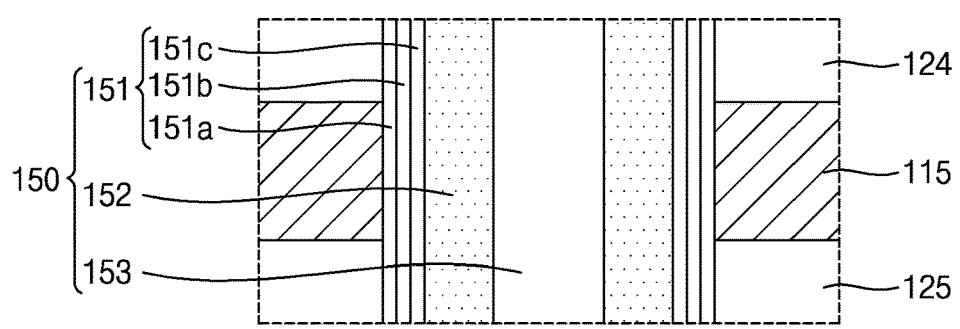
FIG. 3 is an enlarged view of a region P1 according to an example embodiment of FIG. 2.
Figure 4:
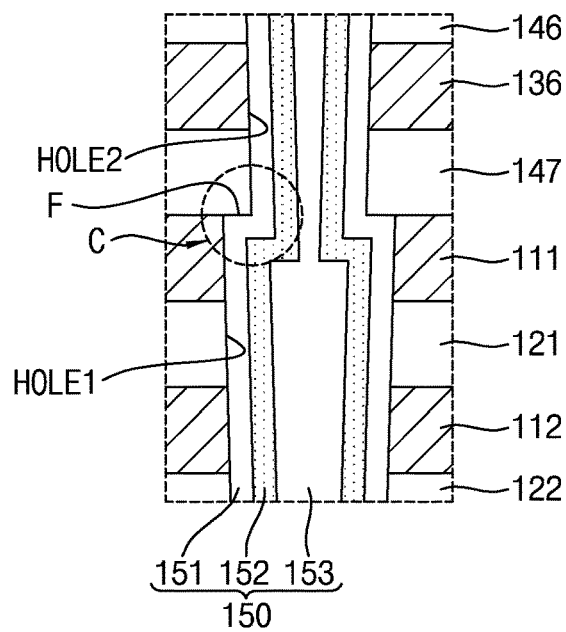
FIG. 4 is an enlarged view of a region P2 according to an example embodiment of FIG. 2.
Figure 5:
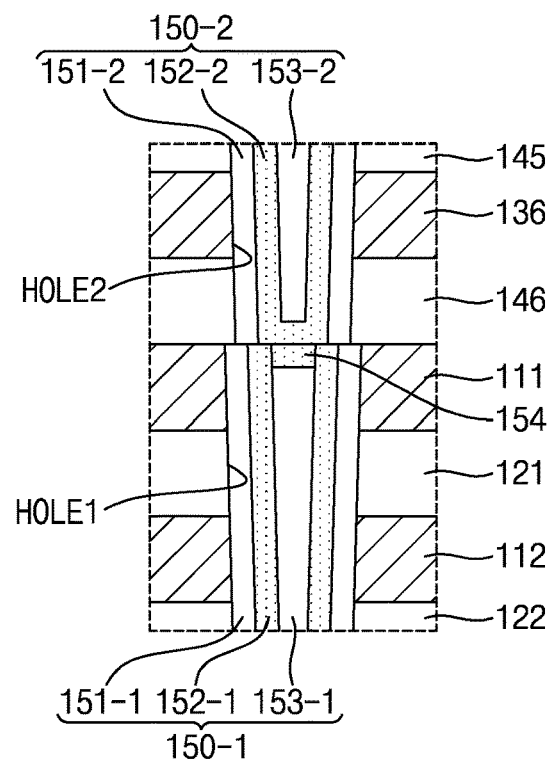
FIG. 5 is an enlarged view of a region P2 according to another example embodiment of FIG. 2.
Figure 6:
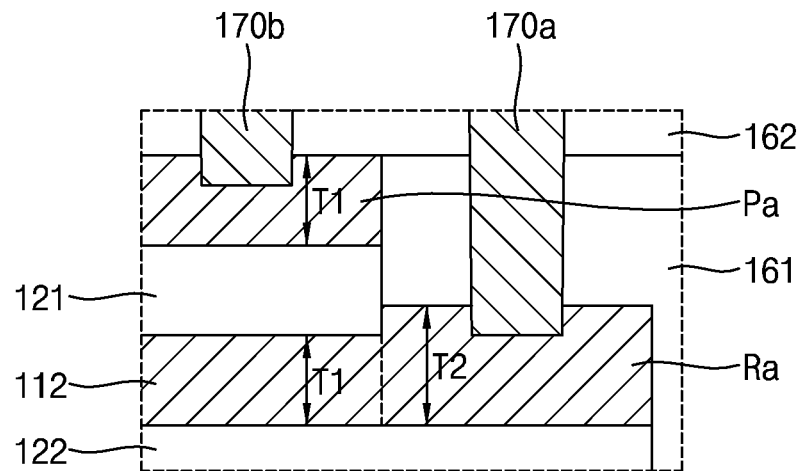
FIG. 6 is an enlarged view of a region P4 according to an example embodiment of FIG. 2.
Figure 7:
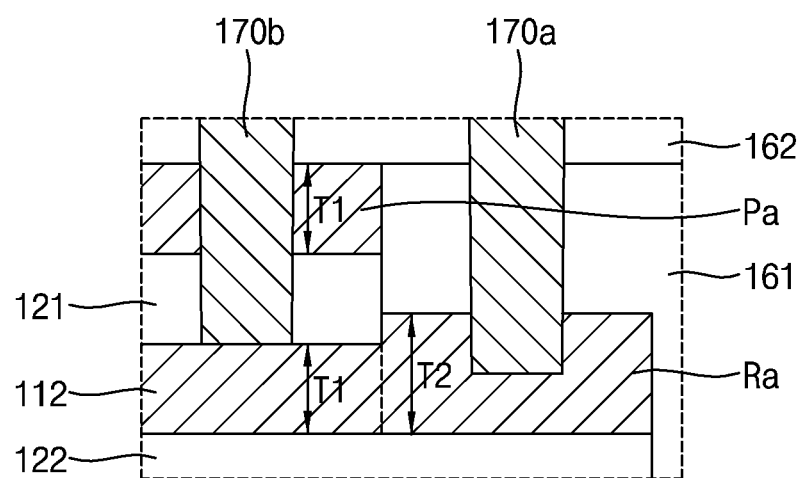
FIG. 7 is an enlarged view of a region P4 according to another example embodiment of FIG. 2.

1. FIG. 3 is an enlarged view of a region P1 according to an example embodiment of FIG. 2. FIG. 4 is an enlarged view of a region P2 according to an example embodiment of FIG. 2. FIG. 5 is an enlarged view of a region P2' according to another example embodiment of FIG. 2. FIG. 6 is an enlarged view of a region P4 according to an example embodiment of FIG. 2. FIG. 7 is an enlarged view of a region P4' according to another example embodiment of FIG. 2. The semiconductor device according to an example embodiment may include a flash memory such as a vertical NAND (V-NAND) or a 3D-NAND.

Referring to FIGS. 1 and 2, a semiconductor device 100 according to an example embodiment may include a cell region CELL and a pad region PAD. The pad region PAD may be placed at an edge of the cell region CELL.

The semiconductor device 100 may include stack structures 110, 120, 130, and 140, channel holes HOLE1 and HOLE2, channel structures CH1, interlayer insulating layers 161, 162, and 163, bit lines BL, plugs 165, contacts 170, and wires 180, which are formed on a substrate 101 having the cell region CELL and the pad region PAD.

The substrate 101 may contain a semiconductor material such as silicon or germanium. In an embodiment, the substrate 101 may contain monocrystalline silicon. For example, the substrate 101 may function as a p-type well of a VNAND.

A plurality of stack structures may be sequentially stacked on the substrate 101. Each of the stack structures may be formed by alternately stacking gate electrodes 110 and 130 and insulating layers 120 and 140. The stack structures may include lower stack structures 110 and 120 placed at relatively low locations and upper stack structures 130 and 140 placed at relatively higher locations. The upper stack structures 130 and 140 may be formed over the lower stack structures 110 and 120.

The lower stack structures 110 and 120 may include lower gate electrodes 110 and lower insulating layers 120, respectively. The lower gate electrodes 110 and the lower insulating layers 120 may be alternately stacked on the substrate 101. The lower gate electrodes 110 and their adjacent lower insulating layers 120 may form a plurality of pairs, which may extend to different lengths in a first direction. For example, the plurality of pairs may include lower gate electrode 111 and lower insulating layer 121, lower gate electrode 112 and lower insulating layer 122, lower gate electrode 113 and lower insulating layer 123, lower gate electrode 114 and lower insulating layer 124, lower gate electrode 115 and lower insulating layer 125, and lower gate electrode 116 and lower insulating layer 126. The lower stack structures 110 and 120 may be formed as a step-shaped structure in the pad region PAD due to the pairs extending to different lengths. The pairs of the lower stack structures 110 and 120 may have lengths in the first direction that decrease with increasing distance from the horizontal semiconductor layer 101. For example, a length in the first direction of individual pairs of the lower stack structures 110 and 120 may incrementally decrease from the bottommost pair of the lower stack structures 110 and 120 (e.g., lower stack structures 116 and 126) to the topmost pair of the lower stack structures 110 and 120 (e.g., lower stack structures 111 and 121), such that the closer the lower stack structures 110 and 120 are to the top of the stack, the smaller the lengths of the lower stack structures 110 and 120.

The lower gate electrodes 110 may contain metals or metal nitrides. For example, the lower gate electrodes 110 may contain metals or metal nitrides having low electrical storage, such as tungsten, tungsten nitrides, titanium, titanium nitrides, tantalum, tantalum nitrides, or platinum. In an embodiment, the lower gate electrodes 110 may have a multi-layered structure in which a barrier film containing a metal nitride and a metal film containing a metal are stacked. The lower insulating layers 120 may contain oxide-based materials such as silicon oxides or silicon oxyfluorides.

The upper stack structures 130 and 140 may include upper gate electrodes 130 and upper insulating layers 140 that are alternately stacked. The upper gate electrodes 130 and the upper insulating layers 140 may be formed in a way similar to that of the lower gate electrodes 110 and the lower insulating layers 120. The upper gate electrodes 130 and the upper insulating layers 140 may contain substantially the same material as that of the lower gate electrodes 110 and the lower insulating layers 120, respectively.

The distinction between the lower stack structures 110 and 120 and the upper stack structures 130 and 140 may be variously changed. The number of stack structures, the number of gate electrodes included in a stack structure, and the number of insulating layers included in a stack structure may be variously changed. For example, the semiconductor device according to an example embodiment including two stack structures may be regarded as including a double-stack. The semiconductor device according to an example embodiment including multiple structures may be regarded as including a multi-stack.

The lower gate electrodes 110 may include a ground selection line GSL and word lines. For example, among the lower gate electrodes 110, a lowermost lower gate electrode 116 may be provided as the ground selection line GSL, and the other gate electrodes 111, 112, 113, 114, and 115 may be provided as the word lines. In an embodiment, at least one of the lower gate electrodes 110 may be a dummy word line. The dummy word line may be placed above or below the lower stack structures 110 and 120. For example, in some embodiments, among the lower gate electrodes 110, an uppermost lower gate electrode 111 may be provided as the dummy word line.

The upper gate electrodes 130 may include a string selection line SSL. In an embodiment, at least one of the upper gate electrodes 130 may be a dummy word line. The dummy word line may be placed above or below the upper stack structures 130 and 140. For example, among the upper gate electrodes 130, an uppermost upper gate electrode 131 may be the dummy word line, and a second uppermost upper gate electrode 132 may be the string selection line SSL.

As described later, a P-type pad P is likely to cause a punching phenomenon during a contact hole forming process. It is possible to prevent the punching phenomenon by using, as the dummy word line, gate electrodes to which the P-type pad P is connected.

The channel holes HOLE1 and HOLE2 may be placed in the cell region CELL on the substrate 101. The channel holes HOLE1 and HOLE2 may extend in a direction substantially vertical to an upper surface of the substrate 101 (a third direction) and pass through the lower gate electrodes 110, the lower insulating layers 120, the upper gate electrodes 130, and the upper insulating layers 140. The channel holes HOLE1 and HOLE2 may be laterally spaced apart from each other in the third direction.

The channel holes HOLE1 and HOLE2 may include a lower channel hole HOLE1 passing through the lower stack structures 110 and 120 and an upper channel hole HOLE2 passing through the upper stack structures 130 and 140. The lower channel hole HOLE1 and the upper channel hole HOLE2 may be connected to each other to form a single space or shaft. The lower channel hole HOLE1 and the upper channel hole HOLE2 may be tapered downward. An upper portion of the lower channel hole HOLE1 may have a greater width than a lower portion of the upper channel hole HOLE2. Each of the lower channel hole HOLE1 and the upper channel hole HOLE2 may be tapered in the downward direction, such that the lower portion of the upper channel hole HOLE2 is narrower than the upper portion of the lower channel hole HOLE1. For example, the upper portion of the lower channel hole HOLE1 may have substantially the same width as the upper portion of the upper channel hole HOLE2, and the lower portion of the lower channel hole HOLE1 may have substantially the same width as the lower portion of the upper channel hole HOLE2. Referring to region P1 illustrated in FIGS. 2 and 3, the channel structures CH1 may be formed in the channel holes HOLE1 and HOLE2. Each of the channel structures CH1 may include an information storage pattern 151, a channel pattern 152, a core pattern 153, and a conductive pad 155. In an embodiment, each of the channel structures may further include an epitaxial pattern (not shown).

The channel pattern 152 may have an annular shape with an empty center. A space formed by the empty center of the channel pattern 152 may be filled with the core pattern 153. The information storage pattern 151 may be placed between the channel pattern 152 and the gate electrodes 110 and 130.

The conductive pad 155 may be formed on the information storage pattern 151, the channel pattern 152, and the core pattern 153, and above the information storage pattern 151, the channel pattern 152, and the core pattern 153 in the third direction. The conductive pad 155 may be electrically connected to a bit line BL and may be provided as a drain region for a plurality of memory cell devices formed in the cell region CELL.

The information storage pattern 151 may include a blocking layer 151a, a charge storage layer 151b, and a tunneling layer 151c. The blocking layer 151a, the charge storage layer 151b, and the tunneling layer 151c may have an oxide-nitride-oxide (ONO) structure in which an oxide film, a nitride film, and an oxide film are sequentially stacked.

The blocking layer 151a may contain a silicon oxide, a silicon nitride, a silicon oxynitride, a dielectric material with a high dielectric constant, or a combination thereof. The charge storage layer 151b may be a charge trapping layer or a floating gate conductive layer. For example, the charge storage layer 151b may contain a dielectric material, a quantum dot, or a nanocrystal. The quantum dot or the nanocrystal may be composed of fine particles of a conductor, for example, a metal or a semiconductor. In an embodiment, when the charge storage layer 151b is a charge trapping layer, the charge storage layer 151b may be made of a silicon nitride. The tunneling layer 151c may pass charges to the charge storage layer 151b in the Fowler-Nordheim (FN) method. The tunneling layer 151c may contain, for example, a silicon oxide, a silicon nitride, a silicon oxynitride, or a combination thereof.

The epitaxial pattern (not shown) may be placed on the upper surface of the substrate 101. When the channel structure CH1 includes the epitaxial pattern, the information storage pattern 151, the channel pattern 152, and the core pattern 153 may be spaced apart from the substrate in the third direction and may be formed on the epitaxial pattern.

Referring to region P2 illustrated in FIGS. 2 and 4, an outer surface of the channel structure CH1 may be formed as a stepwise profile in a region C adjacent to a part with which the lower stack structures 110 and 120 and the upper stack structures 130 and 140 are in contact and may include a horizontal surface F coplanar with upper surfaces of the lower stack structures 110 and 120. For example, the information storage pattern 151 and the channel pattern 152 may have horizontal segments that extend in the first direction, and the core pattern 153 may narrow at the location where the horizontal segments of the information storage pattern 151 and the channel pattern 152 are located. In some embodiments, the amount of narrowing of the core pattern 153 may be the same as twice the distance from the horizontal surface F in the first direction.

Referring to region P2' illustrated in FIG. 5, which corresponds to region P2 illustrated in FIG. 2, in an embodiment, each of the channel structures CH1 may include a lower channel structure 150-1 and an upper channel structure 150-2. The lower channel structure 150-1 may be formed in the lower channel hole HOLE1, and the upper channel structure 150-2 may be formed in the upper channel hole HOLE2. The lower channel structure 150-1 may include a lower information storage pattern 151-1, a lower channel pattern 152-1, a lower core pattern 153-1, and a semiconductor pattern 154. The semiconductor pattern 154 may be above the lower core pattern 153-1 and adjacent to an interior surface of the lower channel pattern 152-1. In an embodiment, the lower channel structure 150-1 may further include an epitaxial pattern (not shown). The upper channel structure 150-2 may include an upper information storage pattern 151-2, an upper channel pattern 152-2, an upper core pattern 153-2, and a conductive pad 155.

An upper portion of the lower channel structure 150-1 may have a greater width than a lower portion of the upper channel structure 150-2. An upper surface of the lower channel structure 150-1 may be coplanar with upper surfaces of the lower stack structures 110 and 120. The upper surface of the lower channel structure 150-1 may be substantially coplanar with an upper surface of the uppermost lower gate electrode 111.

Referring to region P4 illustrated in FIGS. 1 to 6, gate pads P and R may be formed by one end of each of the lower gate electrodes 110 and the upper gate electrodes 130 extending in a first direction. The gate pads P and R may be the portion of a given lower gate electrode 110 or upper gate electrode 130 that extends in the first direction beyond lower gate electrode 110 or upper gate electrode 130 that is located immediately above the given lower gate electrode 110 or upper gate electrode 130.

The gate pads P and R may have different thicknesses in the third direction. Herein, among the gate pads P and R, gate pads with a thickness T2 greater than a thickness T1 of the gate electrodes 110 and 130 to which the gate pads P and R are connected are referred to as R-type pads R. Also, among the gate pads P and R, gate pads with a different thickness than the R-type pad R are referred to as P-type pads P. In an embodiment, the P-type pad P may have a thickness T1 corresponding to the gate electrodes 110 and 130 to which the P-type pad P are connected. In the example of FIG. 6, gate pad Pa is formed by one end of the lower gate electrode 111 and has a thickness T1, and gate pad Ra is formed by one end of the lower gate electrode 112 and has a thickness T2. Here, the gate pad Pa is a P-type pad and may be included in lower stack structures 110 and 120. And the gate pad Ra may be one of the R-type pads, and may refer to an R-type pad positioned closest to the gate pad Pa under the gate pad Pa among the R-type pads.

An upper surface of the R-type pad R may have a higher level than upper surfaces of the gate electrodes 110 and 130 to which the R-type pad R is connected. A lower surface of the R-type pad R may have a level corresponding to lower surfaces of the gate electrodes 110 and 130 to which the R-type pad R is connected. The upper surface and the lower surface of the P-type pad P may have levels corresponding to the upper surfaces and the lower surfaces of the gate electrodes 110 and 130, respectively, to which the P-type pad P is connected. The positional relationship between the upper surfaces and the lower surfaces included in the gate pads R and P and the gate electrodes 110 and 130 may be determined depending on a semiconductor device manufacturing process.

According to an example embodiment, the P-type pad P may include a first pad Pa and a second pad Pb. The first pad Pa may extend from one end of the uppermost lower gate electrode 111 among the lower gate electrodes 110. An upper surface of the first pad Pa may be coplanar with the upper surface of the uppermost lower gate electrode 111. The upper surface of the first pad Pa may be coplanar with the horizontal surface F of the channel structure CH1.

The second pad Pb may extend from one end of the uppermost upper gate electrode 131 among the upper gate electrodes 130. The upper surface of the second pad Pb may be coplanar with the upper surface of the uppermost upper gate electrode 131. The R pad may include a gate pad Ra. The gate pad Ra may refer to an R-type pad located closest to the first pad Pa under the first pad Pa among the R-type pads.

The interlayer insulating layers 161, 162, and 163 may include a lower interlayer insulating layer 161, an upper interlayer insulating layer 162, and an uppermost interlayer insulating layer 163. In the pad region PAD, the lower interlayer insulating layer 161 may cover the upper surface of the substrate 101 and side portions of the lower stack structures 110 and 120. In some embodiments, the lower interlayer insulating layer 161 may cover portions of the top surfaces of the gate pads P and R corresponding to the lower stack structures 110 and 120. In the pad region PAD, the upper interlayer insulating layer 162 may be formed over the lower interlayer insulating layer 161 to cover an upper surface of the lower interlayer insulating layer 161 and side portions of the upper stack structures 130 and 140. In some embodiments, the upper interlayer insulating layer 162 may cover portions of the top surfaces of the gate pads P and R corresponding to the upper stack structures 130 and 140. The uppermost interlayer insulating layer 163 may be formed over the cell region CELL and the pad region PAD to cover the upper surfaces of the upper stack structures 130 and 140 and the upper surface of the upper interlayer insulating layer 162.

An interface formed between the lower interlayer insulating layer 161 and the upper interlayer insulating layer 162 may be formed at a level corresponding to the upper surface of the uppermost lower gate electrode 111 and the upper surface of the first pad Pa connecting to the uppermost lower gate electrode 111. The upper surface of the lower interlayer insulating layer 161 may be substantially coplanar with the upper surface of the uppermost lower gate electrode 111 of the lower stack structures 110 and 120. The upper surface of the lower interlayer insulating layer 161 may be substantially coplanar with the upper surface of the first pad Pa connecting to the uppermost lower gate electrode 111. Also, the upper surface of the lower interlayer insulating layer 161 may be substantially coplanar with the horizontal surface F of the channel structure CH1. In an embodiment, the upper surface of the lower interlayer insulating layer 161 may be substantially coplanar with the upper surface of the lower channel structure 150-1. The upper surface of the lower interlayer insulating layer 161 may be coplanar with upper surfaces of the lower information storage pattern 151-1, the lower channel pattern 152-1, and the semiconductor pattern 154.

The contacts 170 may be in contact with, and electrically connected to, the gate pads R and P through one or more of the interlayer insulating layers 161, 162, and 163. For example, the contacts 170 in contact with the gate pads R and P corresponding to the upper stack structures 130 and 140 and the uppermost lower gate electrode 111 may extend through the interlayer insulating layers 162 and 163. The contacts 170 in contact with the gate pads R and P corresponding to the lower stack structures 110 and 140 (except the uppermost lower gate electrode 111) may extend through the interlayer insulating layers 161, 162, and 163. The contacts 170 may have different lengths depending on the heights of the gate pads R and P with which the contacts are in contact. For example, contacts 170 connected to the upper stack structures 130 and 140 may have a shorter length than contacts 170 connected to the lower stack structures 110 and 120, with the lengths of the contacts 170 increasing the farther each contact 170 is away from the cell region CELL. The contacts 170 may be connected by the gate pads R and P partially being recessed. For example, the contacts 170 may be partially recessed into the gate pads R and P, and the bottom and lower side surfaces of the contacts 170 may be in contact with the gate pads R and P. But the disclosure is not limited thereto. In an embodiment, the contacts 170 may be tapered downward due to high aspect ratios. As used herein, the term "contact," as used herein refers to a connection contact (i.e., touching) unless the context indicates otherwise, and items described as being "electrically connected" are configured such that an electrical signal can be passed from one item to the other.

The wires 180 may extend in the second direction across upper portions of the contacts 170. In some embodiments, the wires 180 may be in contact with the upper portions of the contacts 170. In an embodiment, some of the wires 180 may be connected to a separate wire (not illustrated) extending in a direction other than the second direction. The contacts 170 and the wires 180 may contain metals such as tungsten, aluminum, and the like.

Referring to region P4' illustrated in FIG. 7, which corresponds to region P4 illustrated in FIG. 2, some of the contacts 170 may be formed through the P-type pad P. The contacts 170 may include an R-type contact 170a being in contact with the R-type pad R and a P-type contact 170b being in contact with the P-type pad P.

In the example embodiment of FIG. 7, the P-type contact 170b may be formed through the first pad Pa. During the process in which the contact holes HOLE1 and HOLE2 are formed, while a contact hole is formed on a gate pad to which the lowermost lower gate electrode 116 is connected, the other gate pads may be continuously exposed to an etching process. The thickness T2 of the R-type pad Ra is large enough that a sufficient process margin may be provided. On the other hand, the first pad Pa, which is a P-type pad, has a relatively small thickness T1 and thus there is a relatively high possibility that a punching phenomenon may occur in which the first pad Pa is completely penetrated by a contact hole. The P-type contact 170b formed in the contact hole may be formed through the punched first pad Pa. Further, the P-type contact 170b may be in contact with and electrically connected to a gate electrode 112 placed under the first pad Pa.

The wires 180 may include a coupling wire 180a that is commonly connected to at least two or more of the contacts 170. In an embodiment, the coupling wire 180a may be commonly connected to the P-type contact 170b connected to the first pad Pa, which is a P-type pad, and to the R-type contact 170a connected to the R-type pad Ra placed under the first pad P. The coupling wire 180a may prevent issues associated with a situation in which the P-type contact 170b connected to the P-type pad P is electrically connected to the gate electrode 112 connected to a lower portion of the P-type pad Pa through the P-type pad Pa. In an embodiment, when any one of the two gate electrodes to which the coupling wire is commonly connected is a dummy word line, the other gate electrode may operate as a dummy word line. Dummy word lines in memory devices are not effective to cause transmission of data to external devices. For instance, a dummy word line may not be electrically connected to gates of memory cells, or if a dummy word line is electrically connected to gates of dummy memory cells, such dummy word lines may not be activated or if activated, may not result in communication of any data in such dummy memory cells to a source external to the memory device.

The above description with reference to FIG. 7 may apply to a region P3 of FIG. 2 as well as a region P4 of FIG. 2. Also, the above description with reference to FIG. 7 may apply to a region where the P-type pad P is formed in the semiconductor device, as well as the regions P3 and P4 of FIG. 2.

Figure 8:
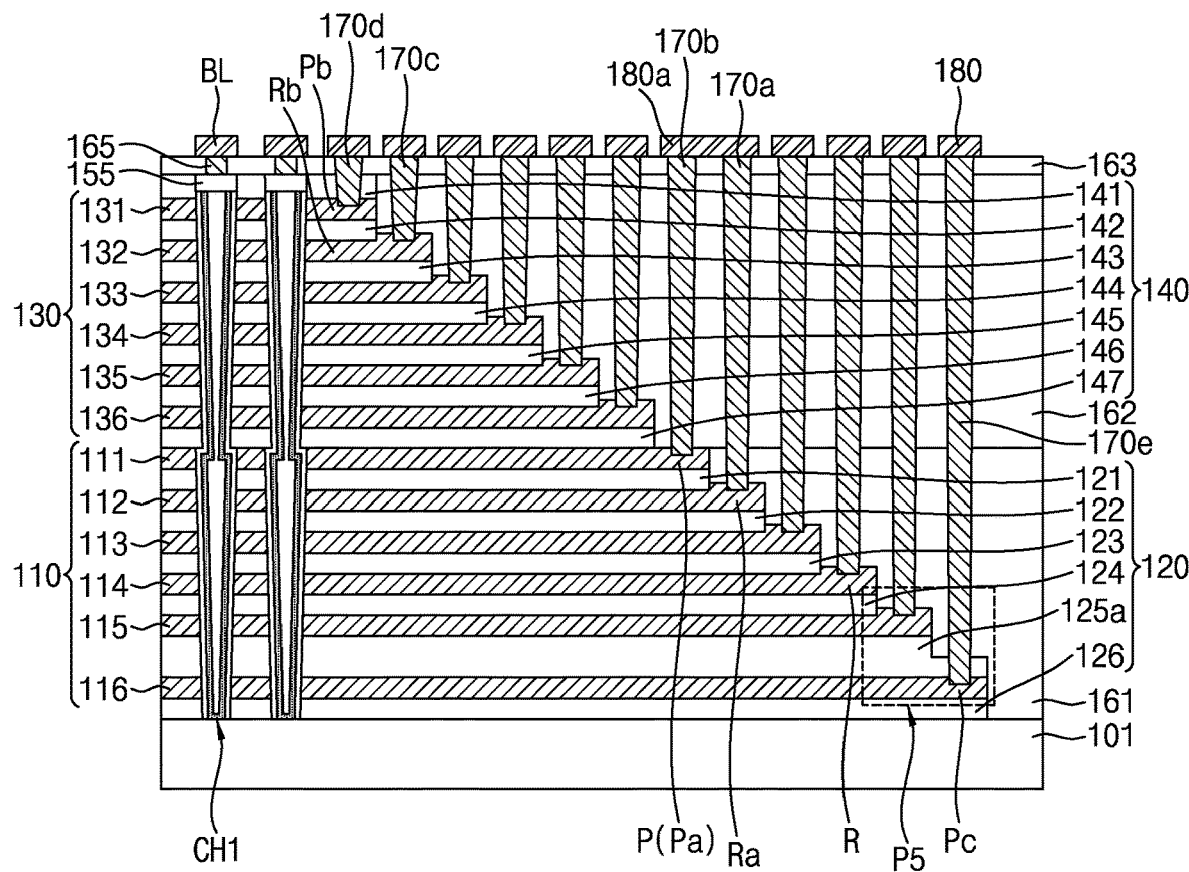
FIG. 8 is a sectional view of a semiconductor device according to an example embodiment.
Figure 9:
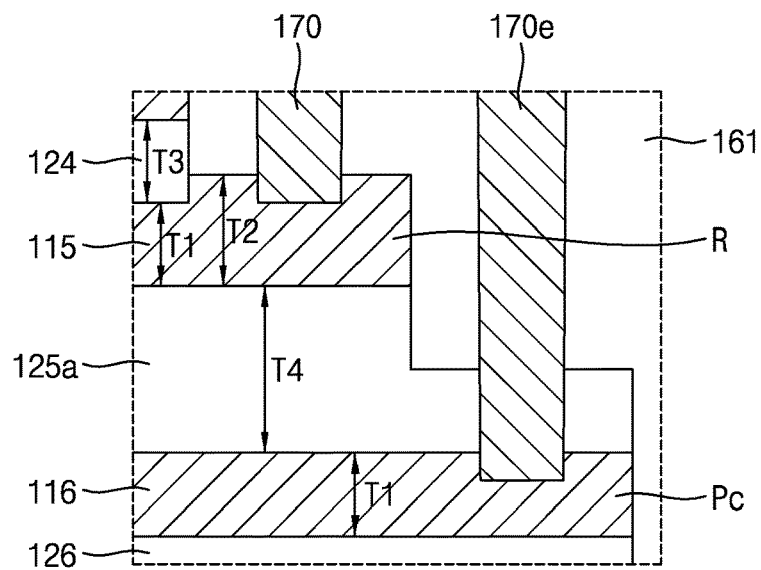
FIG. 9 is an enlarged view of a region P5 according to an example embodiment of FIG. 8.

FIG. 8 is a sectional view of the semiconductor device according to an example embodiment. FIG. 9 is an enlarged view of a region P5 of FIG. 8. In FIGS. 2 and 8, the same reference numerals indicate the same elements. Hereinafter, descriptions of the elements overlapping those of FIG. 2 will be omitted.

Referring to FIGS. 8 and 9, the semiconductor device according to an example embodiment may include insulating layers 120 with different thicknesses. The insulating layers 120 may include a thin insulating layer with a relatively small thickness T3 and a thick insulating layer with a relatively great thickness T4. In an embodiment, the P-type pad P may be connected to one end of the gate electrode being in contact with a lower surface of the thick insulating layer. The thick insulating layer may have one end extending over and covering the P-type pad. In some embodiments, the portion of the thick insulating layer that extends over and covers the P-type pad may have a thickness less than the relatively great thickness T4. For example, the thick insulating layer may extend to the end of the gate electrode layer 110 immediately above it, at which point the thickness reduces to give the thick insulating layer a stepwise profile.

For example, the thick insulating layer may include a first insulating layer 125a formed on the lowermost lower gate electrode 116 of the lower stack structures 110 and 120. A third pad Pc, which is a P-type pad, may be connected to one end of the lowermost lower gate electrode 116. The first insulating layer 125a may cover an upper surface of the third pad Pc, and a portion of a side surface of the contact 170e. For example, the contact 170e may extend through the first insulating layer 125a to the lowermost lower gate electrode 116, and the contact 170e may continue downward so that a top surface of the lowermost lower gate electrode 116 is recessed.

Figure 10:
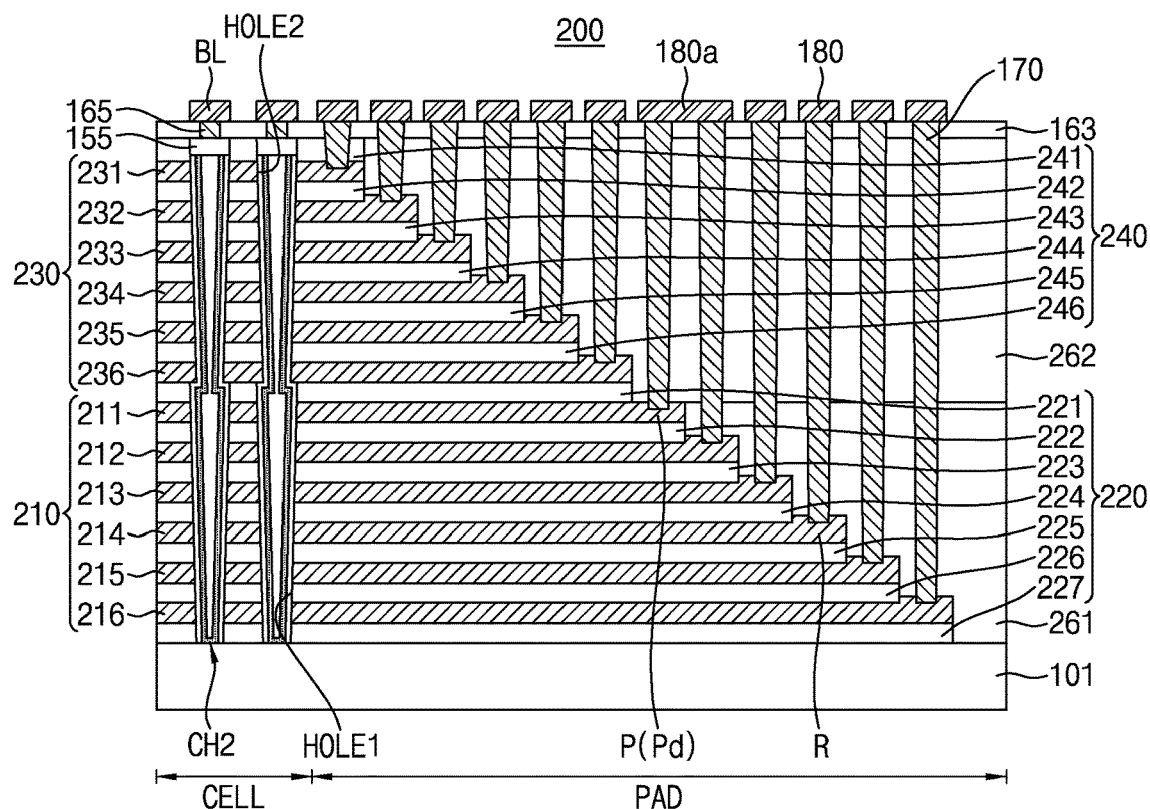
FIGS. 10 to 13 are sectional views of a semiconductor device according to other example embodiments.
Figure 11:
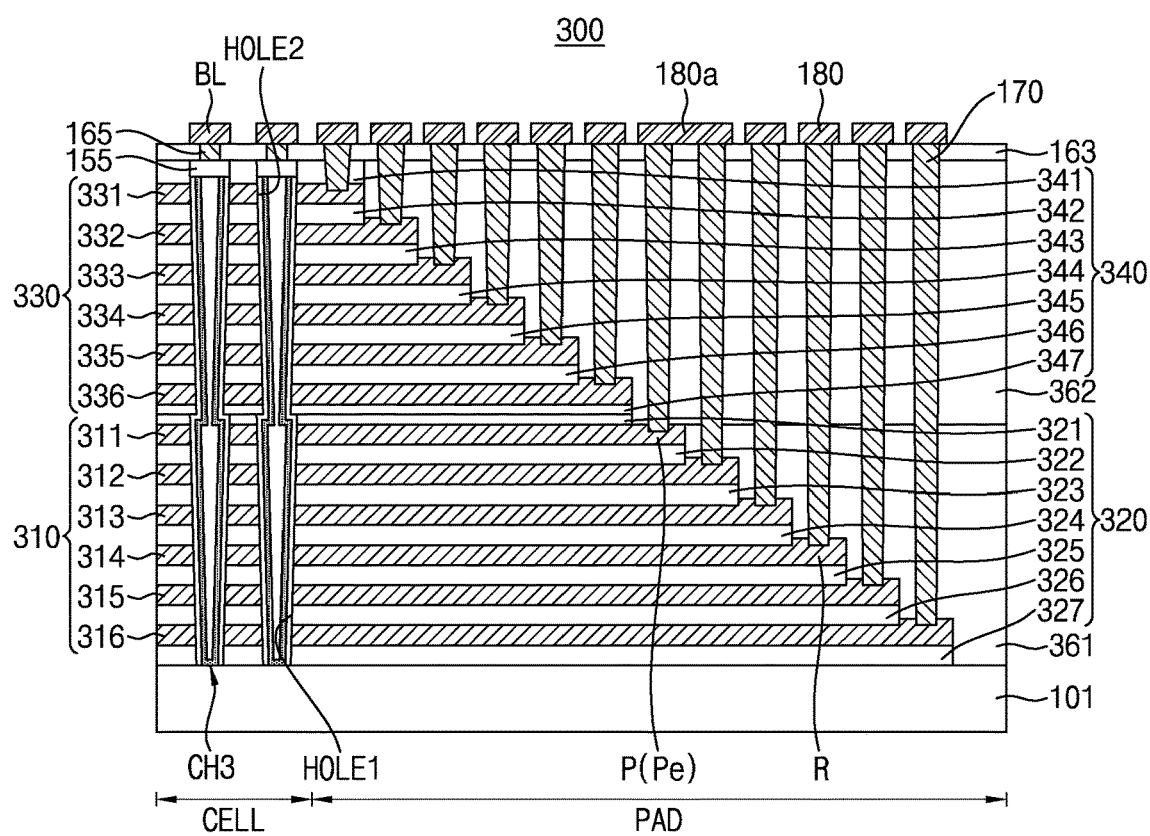

FIGS. 10 to 11 are sectional views of a semiconductor device according to other example embodiments. In FIGS. 2, 8, 10, and 11, the same reference numerals indicate the same elements. Hereinafter, descriptions of the elements overlapping those of FIGS. 2 and 8 will be omitted.

Referring to FIG. 10, a semiconductor device 200 may include stack structures 210, 220, 230, and 240, channel holes HOLE1 and HOLE2, channel structures CH2, interlayer insulating layers 261, 262, and 163, bit lines BL, plugs 165, contacts 170, and wires 180.

The lower stack structures 210 and 220 and the upper stack structures 230 and 240 may be sequentially stacked on the substrate 101. The lower stack structures 210 and 220 may include lower gate electrodes 210 and lower insulating layers 220 that are alternately stacked. Among the lower insulating layers 220, an uppermost lower insulating layer 221 may be placed as an uppermost layer of the lower stack structures 210 and 220.

The upper stack structures 230 and 240 may be formed over the lower stack structures 210 and 220. The upper stack structures 230 and 240 may include upper gate electrodes 230 and upper insulating layers 240 that are alternately stacked. Among the upper gate electrodes 230, a lowermost upper gate electrode 236 may be the lowermost layer of the upper stack structures 230 and 240. The lowermost upper gate electrode 236 may be placed on the uppermost lower insulating layer 221. The uppermost lower insulating layer 221 and the lowermost upper gate electrode 236 may form a pair and extend to the same length in a direction parallel to the substrate 101 (e.g., the first direction).

The channel holes HOLE1 and HOLE2 may pass through the lower stack structures 210 and 220 and the upper stack structures 230 and 240. The channel holes HOLE1 and HOLE2 may include a lower channel hole HOLE1 passing through the lower stack structures 210 and 220 and an upper channel hole HOLE2 passing through the upper stack structures 230 and 240. The lower channel hole HOLE1 and the upper channel hole HOLE2 may be connected to each other to form a single space extending through the lower stack structures 210 and 220 and the upper stack structures 230 and 240.

The channel structures CH2 may be formed in the channel holes HOLE1 and HOLE2. An outer surface of the channel structure CH2 may be formed as a stepwise profile in a region adjacent to a part with which the lower stack structures 210 and 220 and the upper stack structures 230 and 240 are in contact and may include a horizontal surface coplanar with upper surfaces of the lower stack structures 210 and 220. For example, the outer surface of the channel structure CH2 may have a stepwise profile in the region of the lowermost upper gate electrode 236 and the uppermost lower insulating layer 221. The horizontal surface of the channel structure CH2 may be substantially coplanar with an upper surface of the uppermost lower insulating layer 221, which is an uppermost layer of the lower stack structures 210 and 220.

Gate pads R and P may be formed by ends of the gate electrodes 210 and 230 extending in one direction. The gate pads R and P may include an R-type pad R and a P-type pad P, respectively. According to an example embodiment, the P-type pad P may include a first pad Pd formed by an extension of the uppermost lower gate electrode 211. An upper surface of the first pad Pd may be substantially coplanar with an upper surface of the uppermost lower gate electrode 211. Alternatively, the upper surface of the first pad Pd may be recessed and formed at a lower level than that of the upper surface of the uppermost lower gate electrode 211. The upper surface of the first pad Pd may be formed at a lower level than that of the horizontal surface of the channel structure CH2.

The interlayer insulating layers 261, 262, and 163 may include a lower interlayer insulating layer 261, an upper interlayer insulating layer 262, and an uppermost interlayer insulating layer 163. In the pad region PAD, the lower interlayer insulating layer 261 may cover some side portions of the lower stack structures 210 and 220 and the upper surface of the substrate 101. In some embodiments, the lower interlayer insulating layer 261 may cover some portions of the top surfaces of the gate pads P and R corresponding to the lower stack structures 210 and 220. The upper surface of the lower interlayer insulating layer 261 may be substantially coplanar with the upper surface of the first pad Pd. The upper surface of the lower interlayer insulating layer 261 may be substantially coplanar with the upper surface of the uppermost lower gate electrode 211. The upper surface of the lower interlayer insulating layer 261 may be formed at a lower level than that of the horizontal surface of the channel structure CH2. The upper surface of the lower interlayer insulating layer 261 may be formed at a lower level than that of the uppermost lower insulating layer 221. The positional relationship between the upper surfaces included in the lower interlayer insulating layer 221, the uppermost lower gate electrode 211, and the first pad Pd may be determined depending on a semiconductor device manufacturing process.

In the pad region PAD, the upper interlayer insulating layer 262 may be formed over the lower interlayer insulating layer 261 to cover the upper surface of the lower interlayer insulating layer 261, some side portions of the lower stack structures 210 and 220, and side portions of the upper stack structures 230 and 240. A lower surface of the upper interlayer insulating layer 261 may be in contact with the upper surface of the first pad Pd. In some embodiments, the upper interlayer insulating layer 262 may cover portions of the top surfaces of the gate pads P and R corresponding to the upper stack structures 230 and 240. A side surface of the upper interlayer insulating layer 262 may be in contact with a side surface of the uppermost lower insulating layer 221.

The uppermost interlayer insulating layer 163 may formed over the cell region CELL and the pad region PAD to cover the upper surfaces of the upper stack structures 230 and 240 and the upper surface of the upper interlayer insulating layer 262.

Referring to FIG. 11, a semiconductor device 300 may include stack structures 310, 320, 330, and 340, channel holes HOLE1 and HOLE2, channel structures CH3, interlayer insulating layers 361, 362, and 163, bit lines BL, plugs 165, contacts 170, and wires 180 formed on the substrate 101.

The lower stack structures 310 and 320 and the upper stack structures 330 and 340 may be sequentially stacked on the substrate 101. The lower stack structures 310 and 320 may include lower gate electrodes 310 and lower insulating layers 320 that are alternately stacked. A second insulating layer 321, which is an uppermost lower insulating layer, may be placed as an uppermost layer of the lower stack structures 310 and 320. The second insulating layer 321 may have a different thickness than the other lower insulating layers. As shown in FIG. 11, the second insulating layer 321 may have a smaller thickness than the other lower insulating layers. Alternatively, the second insulating layer 321 may have a greater thickness than those of the other lower insulating layers. Alternatively, the second insulating layer 321 may have the same thickness as the other lower insulating layers.

The upper stack structures 330 and 340 may be formed over the lower stack structures 310 and 320. The upper stack structures 330 and 340 may include upper gate electrodes 330 and upper insulating layers 340 that are alternately stacked. A lowermost upper insulating layer 347 may be placed on a lowermost layer of the upper stack structures 330 and 340. The lowermost upper insulating layer 347 may be adjacent to and in contact with the uppermost second insulating layer 321. The uppermost lower insulating layer 321 and the lowermost upper insulating layer 347 may form a pair and extend to the same length in one direction. Also, the lowermost upper insulating layer 347 and the lowermost upper gate electrode 336 may form a pair and extend to the same length in one direction. In some embodiments, the thickness of the lowermost upper insulating layer 347 may be substantially the same as the thickness of the second insulating layer 321. In other embodiments, the thickness of the lowermost upper insulating layer 347 may be greater than or less than the thickness of the second insulating layer 321.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The channel holes HOLE1 and HOLE2 may pass through the lower stack structures 310 and 320 and the upper stack structures 330 and 340. The channel holes HOLE1 and HOLE2 may include a lower channel hole HOLE1 passing through the lower stack structures 310 and 320 and an upper channel hole HOLE2 passing through the upper stack structures 330 and 340. The lower channel hole HOLE1 and the upper channel hole HOLE2 may be connected to each other to form a single space.

The channel structures CH3 may be formed in the channel holes HOLE1 and HOLE2. An outer surface of the channel structure CH3 may be formed as a stepwise profile in a region adjacent to a part with which the lower stack structures 310 and 320 and the upper stack structures 330 and 340 are in contact and may include a horizontal surface coplanar with upper surfaces of the lower stack structures 310 and 320. The horizontal surface of the channel structure CH3 may be substantially coplanar with an upper surface of the uppermost lower insulating layer 321, which is an uppermost layer of the lower stack structures 310 and 320.

Gate pads R and P may be formed by ends of the gate electrodes 310 and 330 extending in the same direction. The gate pads R and P may include an R-type pad R and a P-type pad P, respectively. According to an example embodiment, the P-type pad P may include a first pad Pe formed by an extension of the uppermost lower gate electrode 311. An upper surface of the first pad Pe may be substantially coplanar with an upper surface of the uppermost lower gate electrode 311. Alternatively, the upper surface of the first pad Pe may be recessed and formed at a lower level than that of the upper surface of the uppermost lower gate electrode 311. The upper surface of the first pad Pe may be formed at a lower level than that of the horizontal surface of the channel structure CH3.

The interlayer insulating layers 361, 362, and 163 may include a lower interlayer insulating layer 361, an upper interlayer insulating layer 362, and an uppermost interlayer insulating layer 163. In the pad region PAD, the lower interlayer insulating layer 361 may cover some side portions of the lower stack structures 310 and 320 and the upper surface of the substrate 101. In some embodiments, the lower interlayer insulating layer 361 may cover some portions of the top surfaces of the gate pads P and R corresponding to the lower stack structures 310 and 320. An upper surface of the lower interlayer insulating layer 361 may be substantially coplanar with the upper surface of the first pad Pe. The upper surface of the lower interlayer insulating layer 361 may be substantially coplanar with the upper surface of the uppermost lower gate electrode 311. The upper surface of the lower interlayer insulating layer 361 may be formed at a lower level than that of the horizontal surface of the channel structure CH3. The upper surface of the lower interlayer insulating layer 361 may be formed at a lower level than that of the uppermost lower insulating layer 321. The positional relationship between the upper surfaces included in the lower interlayer insulating layer 321, the uppermost lower gate electrode 311, and the first pad Pe may be determined depending on a semiconductor device manufacturing process.

In the pad region PAD, the upper interlayer insulating layer 362 may be formed over the lower interlayer insulating layer 361 to cover the upper surface of the lower interlayer insulating layer 361, some side portions of the lower stack structures 310 and 320, and side portions of the upper stack structures 330 and 340. A lower surface of the upper interlayer insulating layer 362 may be in contact with the upper surface of the first pad Pe. In some embodiments, the upper interlayer insulating layer 362 may cover portions of the top surfaces of the gate pads P and R corresponding to the upper stack structures 330 and 340. A side surface of the upper interlayer insulating layer 362 may be in contact with a side surface of the uppermost lower insulating layer 321 and a side surface of the lowermost upper insulating layer 347.

Figure 12:
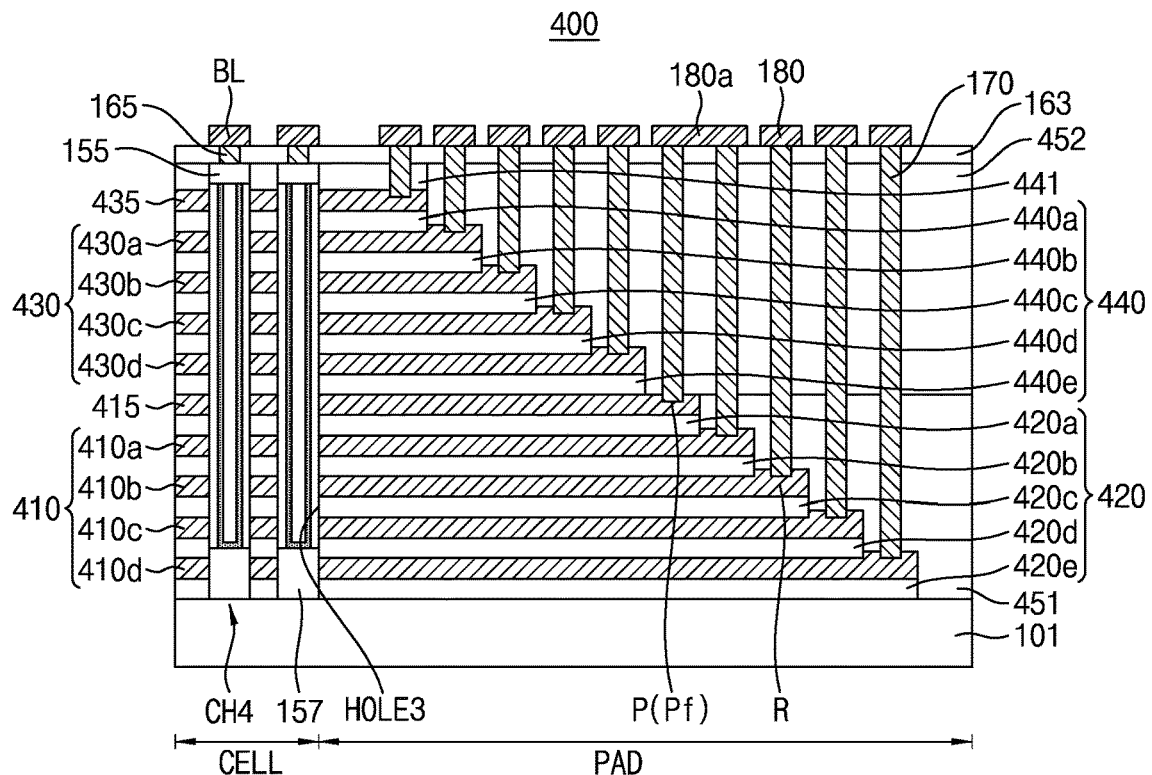
Figure 13:
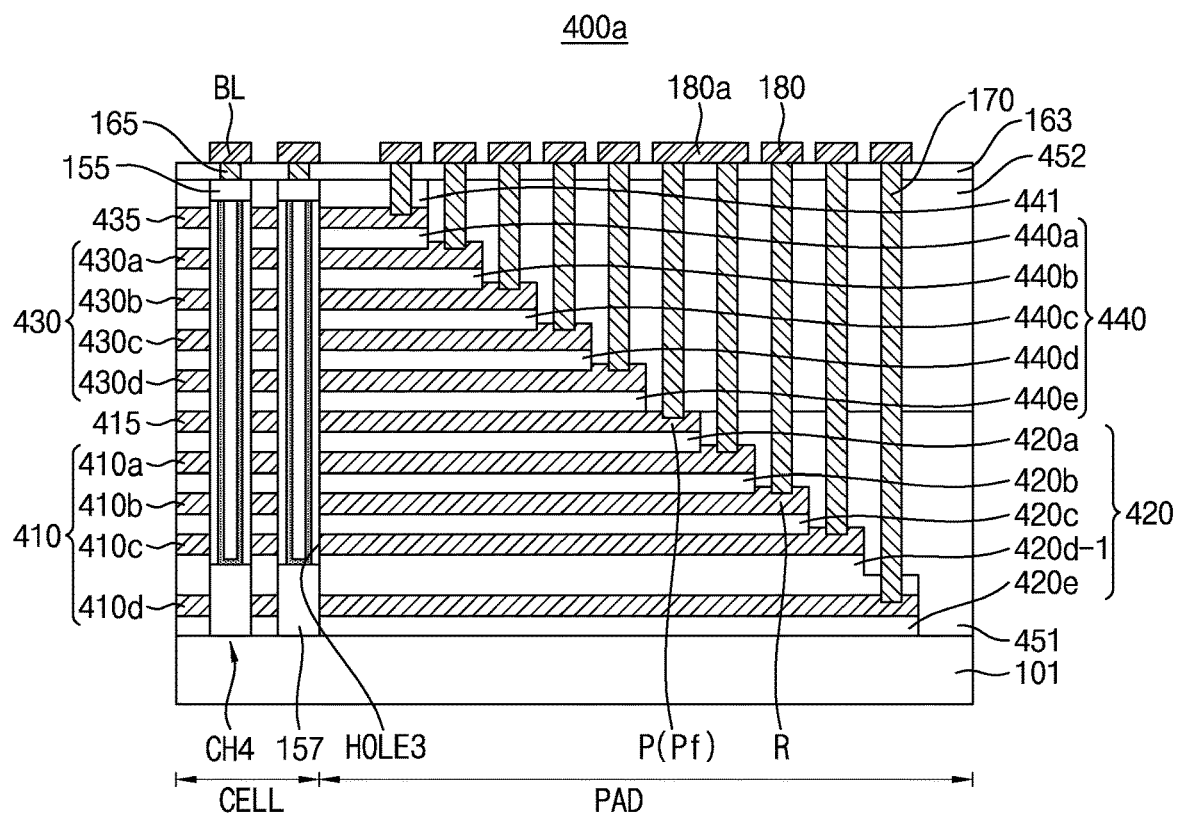

FIGS. 12 and 13 are sectional views of a semiconductor device according to other example embodiments. In FIGS. 2, 8, 12, and 13, the same reference numerals indicate the same elements. Hereinafter, descriptions of the elements overlapping those of FIGS. 2 and 8 will be omitted.

Referring to FIG. 12, a semiconductor device 400 may include a substrate 101, gate electrodes 410, 415, 430, and 435, insulating layers 420, 440, and 441, gate pads P and R, channel holes HOLE3, channel structures CH4, interlayer insulating layers 451, 452, and 163, bit lines BL, plugs 165, contacts 170, and wires 180. The gate electrodes 410, 415, 430, and 435 and the insulating layers 420, 440, and 441 may be alternately stacked on the substrate 101. The gate electrodes 410, 415, 430, and 435 may include lower gate electrodes 410, upper gate electrodes 430, and dummy word lines 415 and 435. The insulating layers 420, 440, and 441 may include lower insulating layers 420, upper insulating layers 440, and an uppermost insulating layer 441.

In an embodiment, the lower gate electrodes 410 and the lower insulating layers 420 may be alternately stacked on the substrate 101 to form the lower stack structures 410 and 420. The upper gate electrodes 430 and the upper insulating layers 440 may be alternately stacked on the lower stack structures 410 and 420 to form the upper stack structures 430 and 440. In FIG. 12, the gate electrodes and the insulating layers may be separately placed in the lower stack structures and the upper stack structures, but the disclosure is not limited thereto. The semiconductor device has a single-stack structure and may include at least two stack structures formed through different planarization processes.

At least one of the gate electrodes 410, 415, 430, and 435 may be a dummy word line. In an embodiment, the gate electrodes 410, 415, 430, and 435 may include a first dummy word line 415. The first dummy word line 415 may be placed between the lower stack structures 410 and 420 and the upper stack structures 430 and 440. The gate electrodes 410, 415, 430, and 435 may further include a second dummy word line 435. The second dummy word line 435 may be placed on the upper stack structures 430 and 440. An uppermost insulating layer 441 may be placed on the second dummy word line 435. Dummy word lines included in the disclosed embodiments are not limited to the first dummy word line 415 and the second dummy word line 435. In a semiconductor device with a single-stack structure, a dummy word line may be placed between stack structures formed through different planarization processes. Gate pads R and P may be formed by ends of the gate electrodes 410, 415, 430, and 435 extending in one direction. The gate pads R and P may include an R-type pad R and a P-type pad P, respectively. The R-type pad R may be connected to the lower gate electrodes 410 (e.g., 410a, 410b, 410c, and 410d) and the upper gate electrodes 430 (e.g., 430a, 430b, 430c, and 430d). The R-type pad R may have a greater thickness than the gate electrodes to which they are connected. The P-type pad P may be connected to the dummy word lines 415 and 435. The P-type pad P and the R-type pad R may have different thicknesses. For example, the P-type pads P may have a smaller thickness than the R-type pads R. The P-type pads P may have the same thickness as the dummy word lines to which they are connected.

The interlayer insulating layers 451, 452, and 163 may include a lower interlayer insulating layer 451, an upper interlayer insulating layer 452, and an uppermost interlayer insulating layer 163. In the pad region PAD, the lower interlayer insulating layer 451 may cover side portions of the lower stack structures 410 and 420 and the upper surface of the substrate 101. Also, the lower interlayer insulating layer 451 may be in contact with a side surface of the first dummy word line 415. In some embodiments, the lower interlayer insulating layer 451 may cover some portions of the top surfaces of the gate pads P and R corresponding to the lower stack structures 410 and 420. An upper surface of the lower interlayer insulating layer 451 may be coplanar with an upper surface of the first dummy word line 415.

In the pad region PAD, the upper interlayer insulating layer 452 may be formed over the lower interlayer insulating layer 451. The upper interlayer insulating layer 452 may cover an upper surface of the upper interlayer insulating layer 451, side portions of the upper stack structures 430 and 440, and an upper surface of the first dummy word line 415. Also, the upper interlayer insulating layer 452 may be in contact with a side surface of the second dummy word line 435 and a side surface of the uppermost insulating layer 441. In some embodiments, the upper interlayer insulating layer 452 may cover portions of the top surfaces of the gate pads P and R corresponding to the upper gate electrodes 430 and dummy word line 415.

The channel holes HOLE3 may be formed in the cell region CELL. The channel holes HOLE3 may be formed by vertically passing through the gate electrodes 410, 415, 430, and 435 and the insulating layers 420, 440, and 441. The channel holes HOLE3 may have a constant cross-sectional area, starting from an upper end to a lower end. Alternatively, the channel holes HOLE3 may have a cross-sectional area decreasing starting from an upper end at the uppermost interlayer insulating layer 163 to a lower end at the top surface of the substrate 101.

The channel structures CH4 may be formed in the channel holes HOLE3. Each of the channel structures CH4 may include an epitaxial pattern 157 on an upper surface of the substrate 101 and a conductive pad 155 above an information storage pattern, a channel pattern, a core pattern. The information storage pattern, the channel pattern, and the core pattern may be comprised of the same materials as those of the information storage pattern 151, the channel pattern 152, and the core pattern 153 described in connection with FIG. 3. In some embodiments, the epitaxial pattern 157 may be omitted.

The contacts 170 may be in vertical contact with or electrically connected to the gate pads P and R through the interlayer insulating layers 451 and 452. The contacts 170 may include an R-type contact being in contact with the R-type pad R and a P-type contact being in contact with the P-type pad P.

The wires 180 may be connected to upper ends of the contacts 170. The wires 180 may include a coupling wire 180a that is commonly connected to the R-type pad R and the P-type pad P.

Referring to FIG. 13, a semiconductor device 400a may include gate electrodes 410, 415, 430, and 435, insulating layers 420, 440, and 441, interlayer insulating layers 451, 452, and 163, channel holes HOLE3, channel structures CH4, contacts 170, plugs 165, and wires 180.

In an embodiment, a P-type pad may be connected to a lowermost gate electrode 410d among the gate electrodes 410, 415, 430, and 435. At least one of the insulating layers 420, 440, and 441 may be a first insulating layer 420d-1 having a greater thickness than the other insulating layers. The first insulating layer 420d-1 may be formed in contact with an upper surface of the lowermost gate electrode 410d among the gate electrodes 410. The first insulating layer 420d-1 may cover an upper surface of the P-type pad connecting to the lowermost gate electrode 410d. The contact 170 extending to the P-type pad connecting to the lowermost gate electrode 410d may extend through the first insulating layer 420d-1 to contact the P-type pad.

FIGS. 14 to 28 are diagrams illustrating a semiconductor device manufacturing method according to an example embodiment. For example, FIGS. 14 to 28 are diagrams illustrating a method of manufacturing the semiconductor device shown in FIG. 8.

Figure 14:
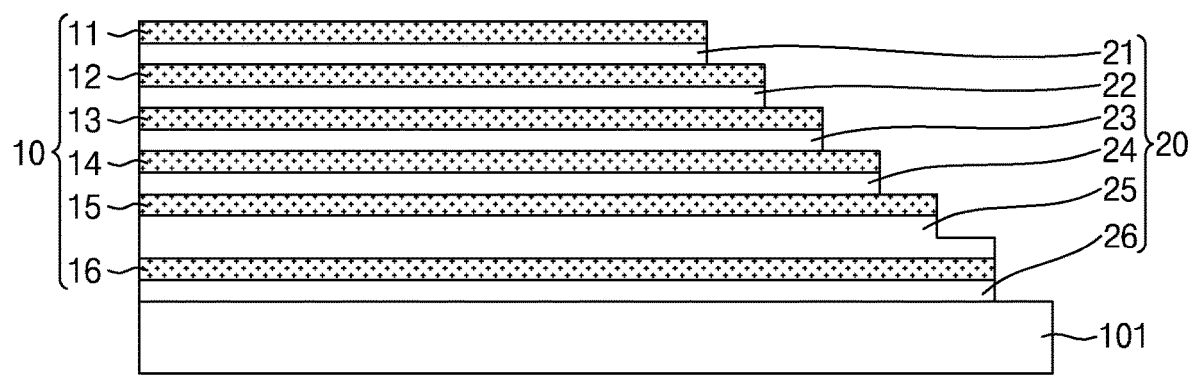
FIGS. 14 to 28 are sectional views shown in a processing order in order to describe a method of manufacturing a semiconductor device according to an example embodiment.

Referring to FIG. 14, a lower stack structure in which lower insulating layers 20 and lower sacrificial layers 10 are alternately stacked may be formed on a substrate 101. A stepwise lower structure 10 and 20 may be formed by sequentially and partially etching a side portion of the lower stack structure 10 and 20.

The substrate 101 may contain a semiconductor material such as monocrystalline silicon or germanium. An uppermost lower sacrificial layer 11 may be formed as an uppermost portion of the lower structure 10 and 20. In an embodiment, at least one of the lower insulating layers 20 may have a greater thickness than the other lower insulating layers 20. For example, a thick lower insulating layer 25 may be formed in contact with an upper surface of a lowermost lower sacrificial layer 16. However, the disclosure is not limited thereto, and the lower insulating layers 20 may have the same thickness.

The lower insulating layers 20 may contain oxide-based materials such as silicon oxides, silicon carbides, or silicon oxyfluorides. The lower sacrificial layers 10 may have an etch selectivity relative to an insulating layer. The lower sacrificial layers 10 may be formed of a material that may be easily removed through a wet etching process. For example, the lower sacrificial layers 10 may contain nitride-based materials such as silicon nitrides or silicon boron nitrides.

The lower insulating layers 20 and the sacrificial layers may be formed using at least one of a Chemical Vapor Deposition (CVD) process, a Plasma Enhanced Chemical Vapor Deposition (PECVD) process, a High Density Plasma Chemical Vapor Deposition (HDP-CVD) process, an Atomic Layer Deposition (ALD) process, and a sputtering process.

Figure 15:
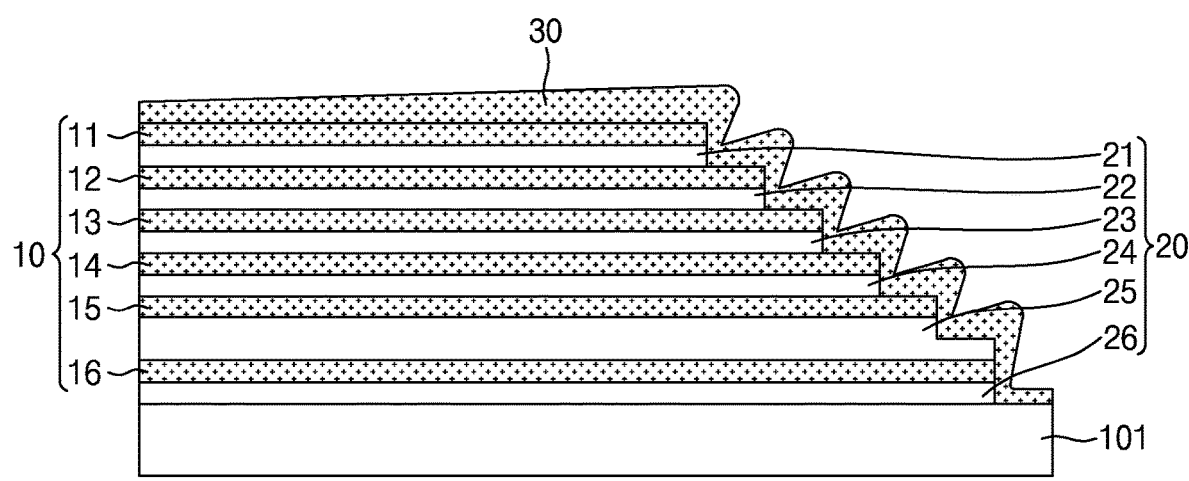

Referring to FIG. 15, an additional lower sacrificial layer 30 may be formed on the lower structure 10 and 20. The additional lower sacrificial layer 30 may contain a material that is substantially the same as or similar to the nitride-based material contained in the sacrificial layer.

The additional lower sacrificial layer 30 may be formed to contain a silicon nitride through a deposition process performed under a low step-coverage condition. The additional lower sacrificial layer 30 may be relatively thin on a side wall of the lower structure 10 and 20 and be relatively thick on an upper surface of the lower structure 10 and 20.

Figure 16:
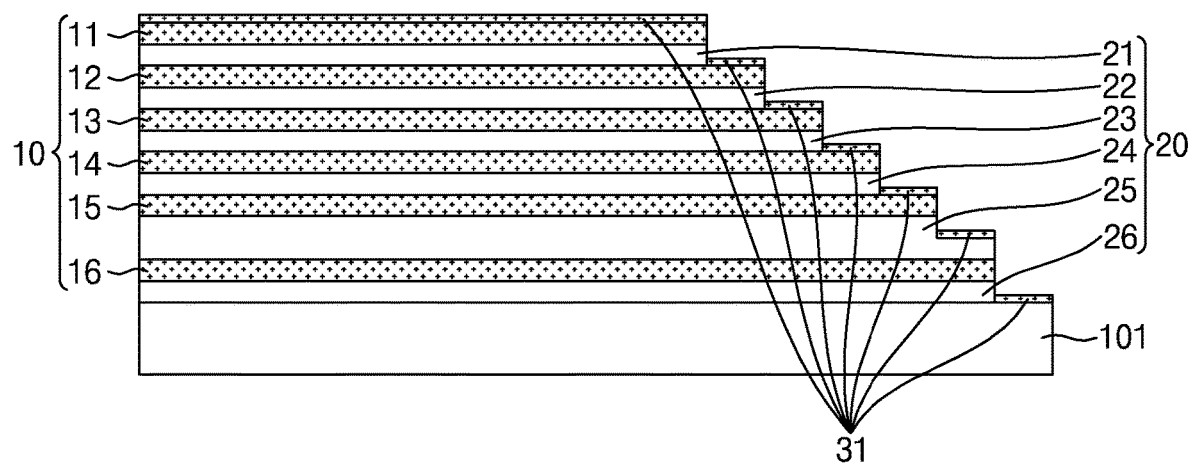

Referring to FIG. 16, additional lower sacrificial layer patterns 31 may be formed by partially removing the additional lower sacrificial layer 30. Through the process in which the additional lower sacrificial layer 30 is partially removed, an additional lower sacrificial layer part formed on the side wall of the lower structure 10 and 20 may be substantially removed. An additional lower sacrificial layer part formed on an upper surface of the additional lower sacrificial layer 30 may partially remain such that the additional lower sacrificial layer patterns 31 are formed. The additional lower sacrificial layer patterns 31 may be formed on an upper surface of each stepwise portion of the lower structure 10 and 20. The additional lower sacrificial layer patterns 31 may be substantially integrated with the lower sacrificial layers 10.

In an embodiment, the additional lower sacrificial layer patterns 31 may also be formed on the lower insulating layer 25. When the lower structure 10 and 20 includes the lower insulating layer 25, which is relatively thick, the thick lower insulating layer 25 may form a portion of the stepwise portions of the lower structure 10 and 20. The additional lower sacrificial layer patterns 31 may be formed on an upper surface of the stepwise portion formed by the thick lower insulating layer 25. An additional lower sacrificial layer pattern 31 may not be formed on a lower sacrificial layer 16 that is in contact with a lower surface of the thick lower insulating layer 25.

Figure 17:
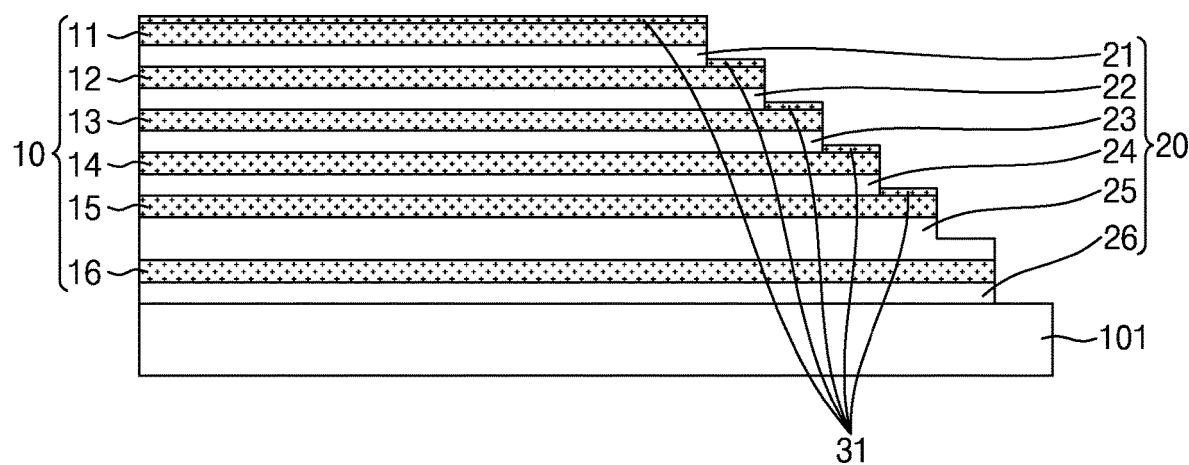

Referring to FIG. 17, the additional lower sacrificial layer pattern 31 formed on the thick lower insulating layer 25 and the additional lower sacrificial layer pattern 31 formed on the substrate 101 may be removed. Some regions of the lower structure 10 and 20 may be covered with a photoresist film, and an exposed additional lower sacrificial layer pattern 31 may be removed. In an embodiment, the removal process will be omitted when the lower insulating layer 20 of the lower structure 10 and 20 has a constant thickness. For example, when the lower insulating layer 25 has a same thickness as the other lower insulating layers 20, the lower insulating layer 25 may be formed to extend to the same length as the lower sacrificial layer 15. In such embodiments, the lower insulating layer 25 may not extend to the same length as the lowermost lower sacrificial layer 16 and the removal process will not be performed.

Figure 18:
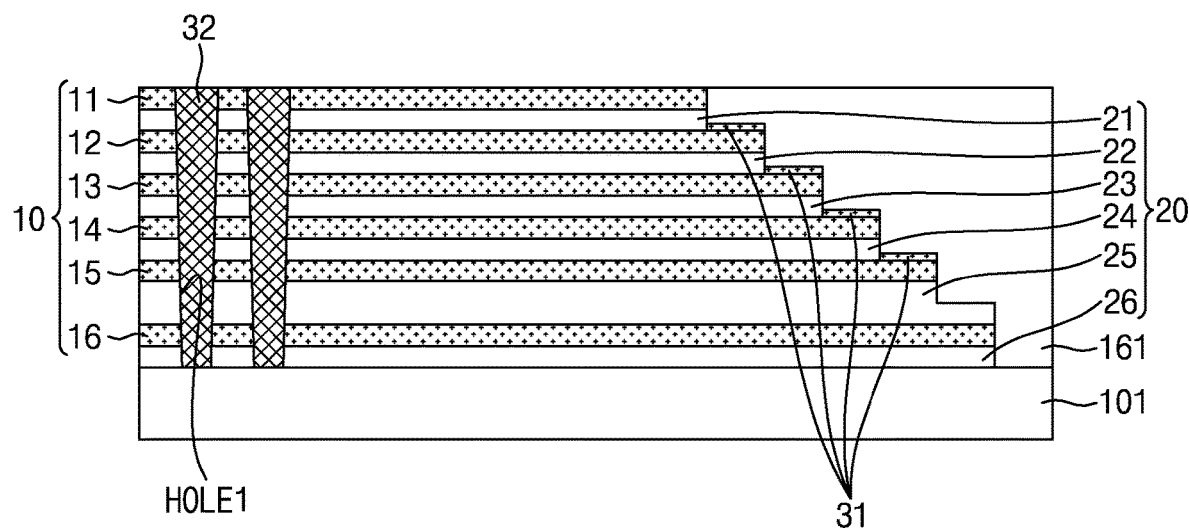

Referring to FIG. 18, a lower interlayer insulating layer 161 may be formed to cover a side portion of the lower structure 10 and 20. A channel hole HOLE1 may be formed through the lower structure 10 and 20. A dummy channel structure 32 may be formed in the channel hole HOLE1. Upper portions of the lower structure 10 and 20, the lower interlayer insulating layer 161, and the dummy channel structure 32 may be planarized through a chemical mechanical polishing (CMP) process. The additional sacrificial layer pattern 31 formed on the upper surface of the lower structure 10 and 20 may be removed through a planarization process, and the uppermost lower sacrificial layer 11 may be exposed to the upper portion of the lower structure 10 and 20 again. Upper ends of the lower structure 10 and 20, the lower interlayer insulating layer 161, the channel hole HOLE1, and the dummy channel structure 32 may be formed at a corresponding level through the planarization process. Upper surfaces of the lower structure 10 and 20, the lower interlayer insulating layer 161, and the dummy channel structure 32 may be substantially coplanar with one another through the planarization process.

Figure 19:
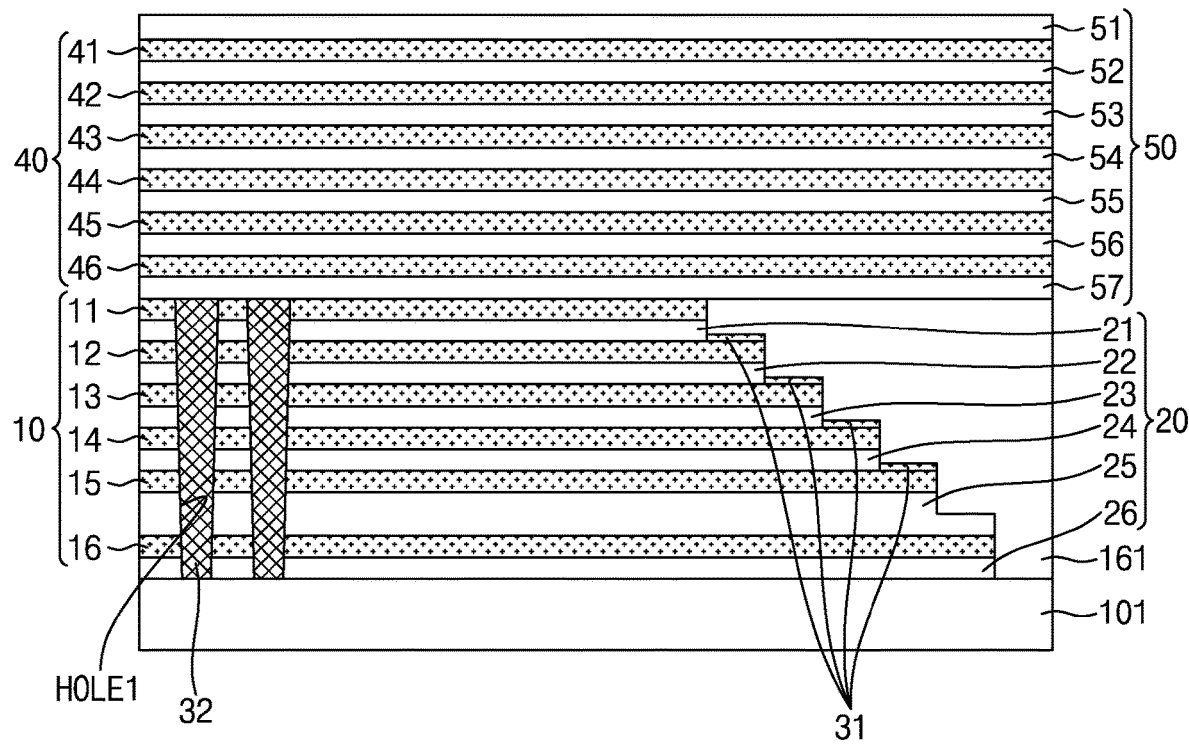

Referring to FIG. 19, an upper stack structure 40 and 50 in which upper sacrificial layers 40 and upper insulating layers 50 are alternately stacked may be formed on the lower structure 10 and 20 and the lower interlayer insulating layer 161. Among the upper insulating layers 50, an uppermost upper insulating layer 51 may be placed as an uppermost layer of the upper stack structure 40 and 50. Among the upper insulating layers 50, a lowermost upper insulating layer 57 may be placed as a lowermost layer of the upper stack structure 40 and 50.

The upper sacrificial layers 40 and the upper insulating layers 50 may be formed in similar ways to those of the lower sacrificial layers 10 and the lower insulating layers 20, respectively. The upper sacrificial layers 40 and the upper insulating layers 50 may contain substantially the same materials as the lower sacrificial layers 10 and the lower insulating layers 20, respectively.

Figure 20:
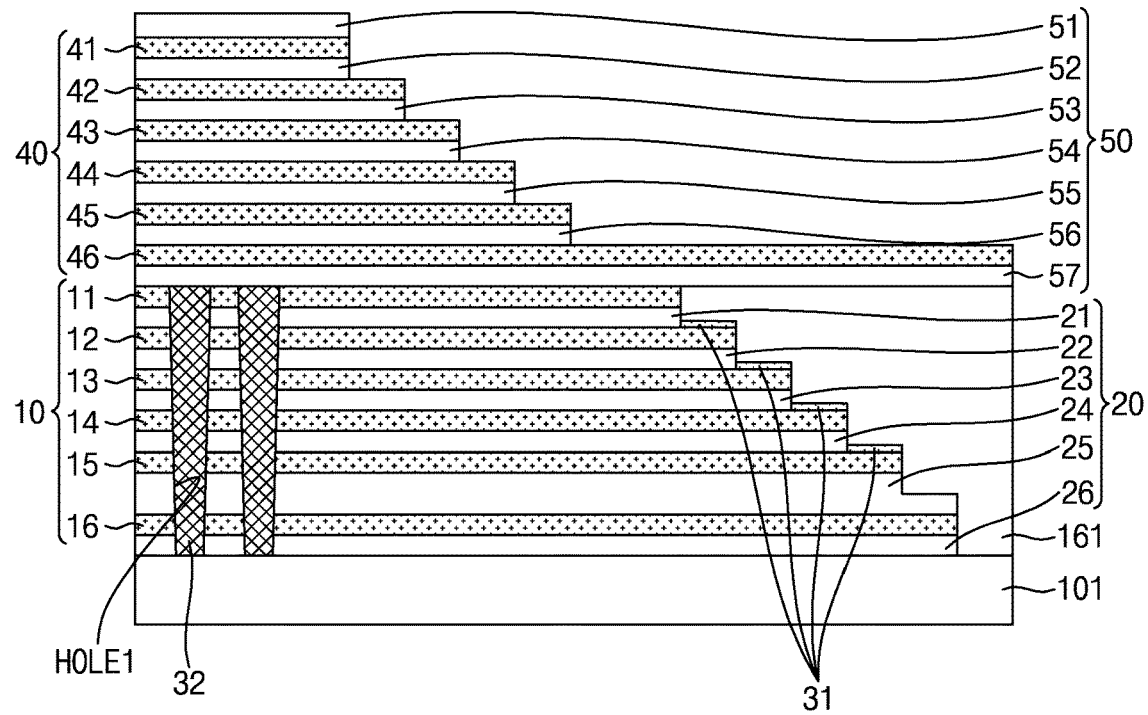

Referring to FIG. 20, stepwise upper structure 40 and 50 may be formed by sequentially and partially etching a side portion of the upper stack structure 40 and 50. In an embodiment, a lowermost upper sacrificial layer 46 and a lowermost upper insulating layer 57 of the upper structure 40 and 50 may not be etched out and may continue to cover the lower structure 10 and 20 and lower interlayer insulating layer 161.

Figure 21:
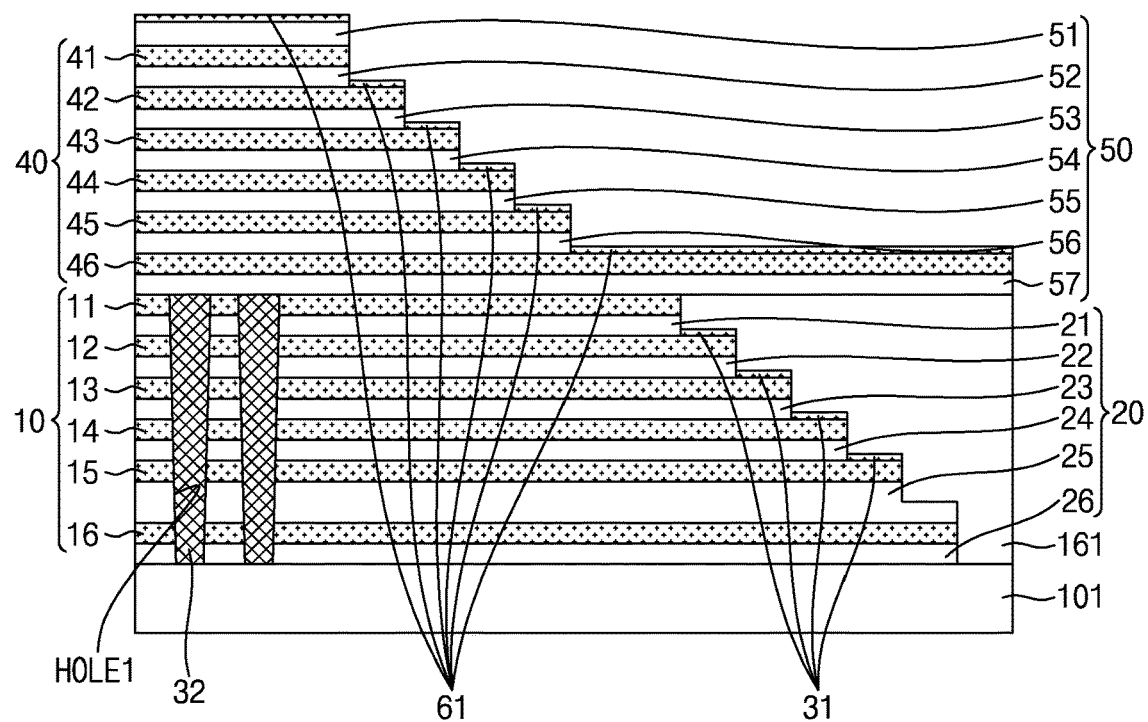

Referring to FIG. 21, additional upper sacrificial layer patterns 61 may be formed on the upper structure 40 and 50. The upper sacrificial layer patterns 61 may contain a material that is substantially the same as or similar to a nitride-based material contained in the upper sacrificial layers 40. The upper sacrificial layer patterns 61 may be formed through a similar process to that of the lower sacrificial layer patterns 31.

Figure 22:
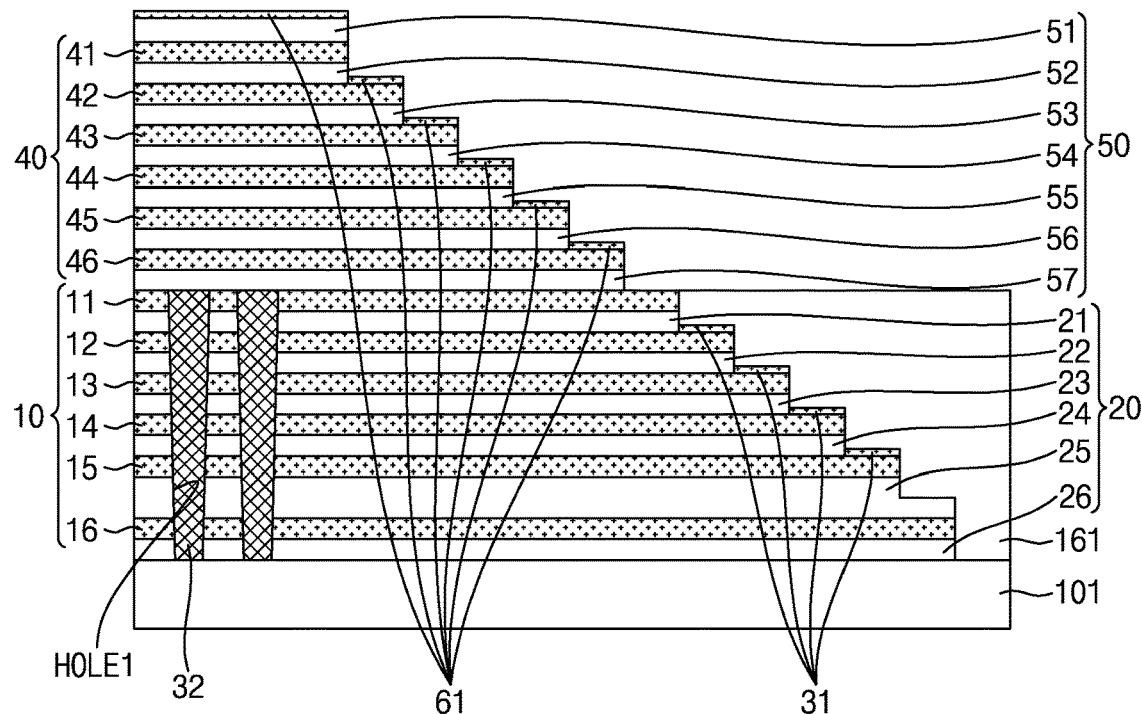

Referring to FIG. 22, some regions of the upper structure 40 and 50 on which the additional upper sacrificial layer patterns 61 are formed may be covered with a photoresist film, and an exposed portion of the additional upper sacrificial layer patterns 61 may be removed. A portion of each of the lowermost upper insulating layer 57 and the lowermost upper sacrificial layer 46 may be removed along with the exposed portion of the additional upper sacrificial layer patterns 61, and a portion of an upper surface of the lower structure 10 and 20 may be exposed. In addition, and upper surface of the lower interlayer insulating layer 161 may be exposed.

Figure 23:
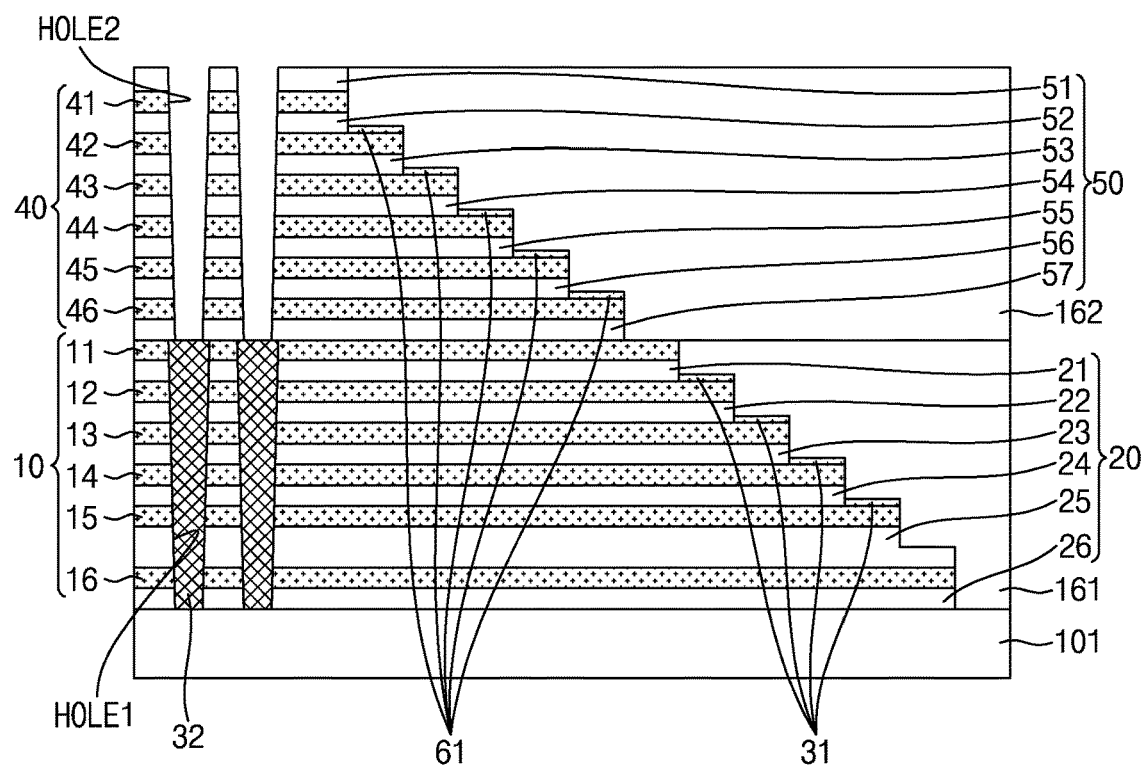

Referring to FIG. 23, an upper interlayer insulating layer 162 may be formed to cover a side portion of the upper structure 40 and 50 and the upper surface of the lower interlayer insulating layer 161. Upper portions of the upper structure 40 and 50 and the upper interlayer insulating layer may be planarized through a CMP process. Additional upper sacrificial layer patterns 61 placed in an uppermost portion of the upper structure 40 and 50 may be removed through a planarization process.

An upper channel hole HOLE2 may be formed through the upper structure 40 and 50. The upper channel hole HOLE2 may be formed on the lower channel hole HOLE1 and connected to the lower channel hole HOLE1. An upper surface of the dummy channel structure 32 may be exposed through a lower end of the upper channel hole HOLE2.

Figure 24:
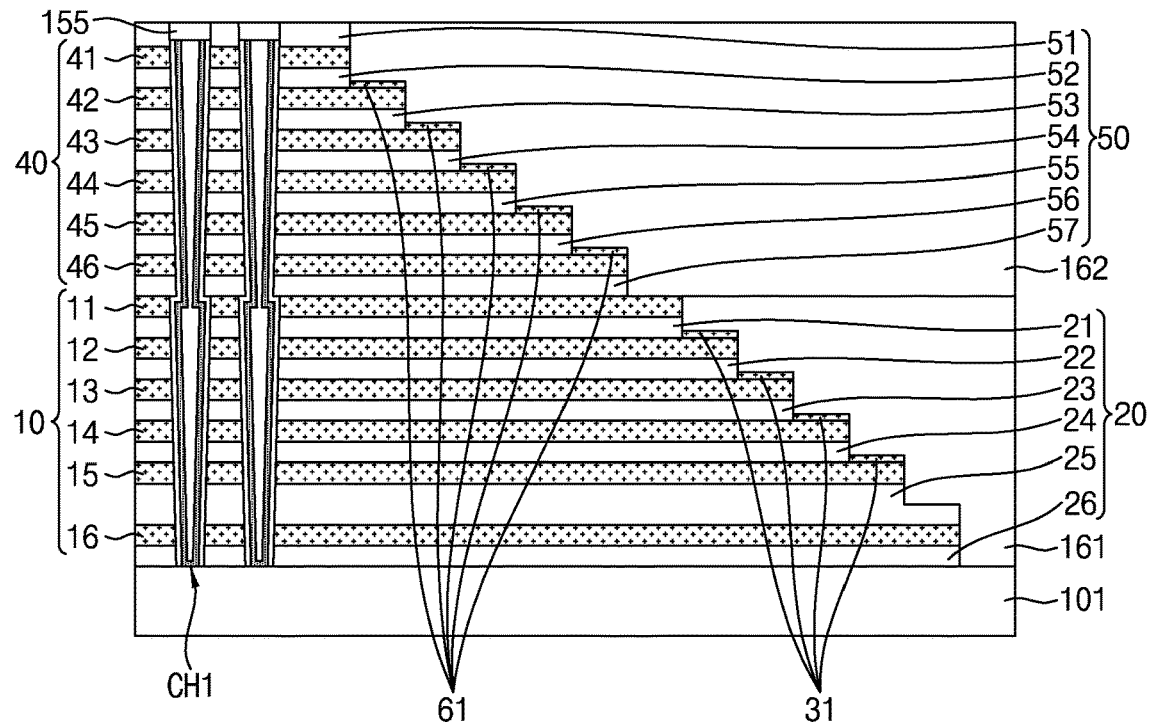

Referring to FIG. 24, the dummy channel structure 32 may be removed from the lower channel hole HOLE1. The lower channel HOLE1 from which the dummy channel structure 32 is removed and the upper channel hole HOLE2 which are placed on the lower channel hole HOLE1 may be connected to each other to form a single space and form a single channel hole. For example, the upper channel hole HOLE2 and the lower channel hole HOLE1 may be communicatively connected with one another such that fluids can travel unimpeded from one hole to another.

A channel structure CH1 may be formed in the single channel hole. An epitaxial pattern (not shown) may be formed at a lower portion of the channel hole, and an information storage pattern, a channel pattern, a core pattern, and a conductive pad may be formed on the epitaxial pattern. In an embodiment, the epitaxial pattern may be omitted.

Figure 25:
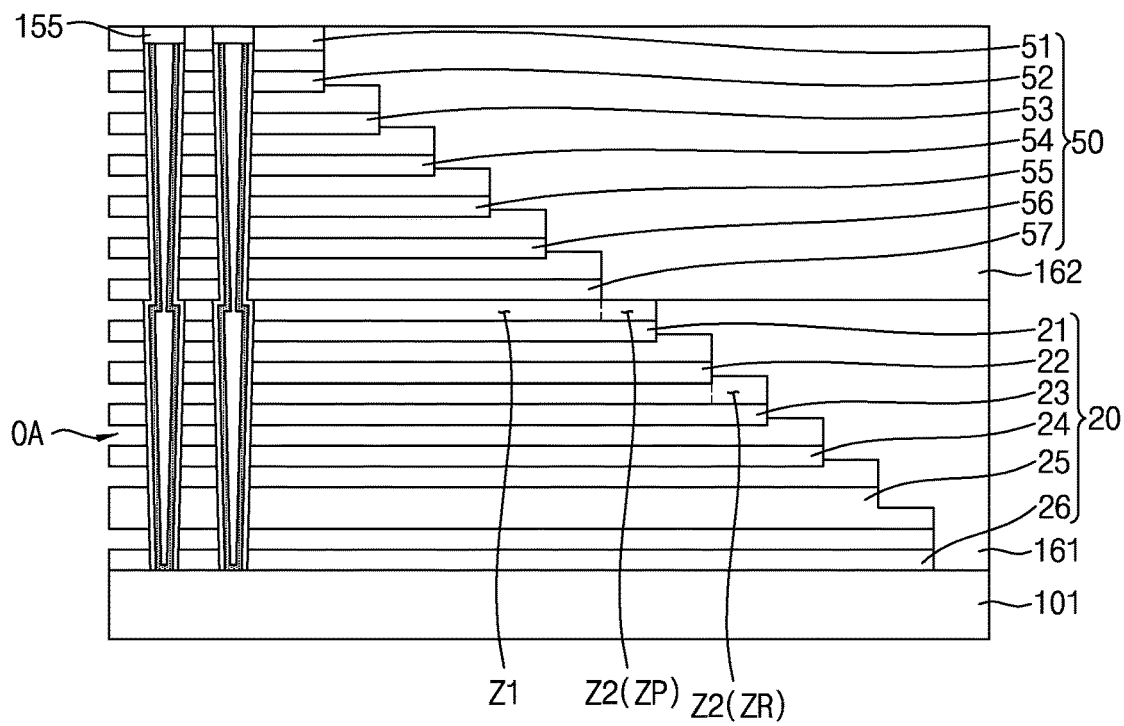

Referring to FIG. 25, the lower sacrificial layers 10 and the upper sacrificial layers 40 may be removed from the lower structure 10 and 20 and the upper structure 40 and 50. An opening (not shown) that exposes side surfaces of the lower structure 10 and 20, the upper structure 40 and 50, and the lower interlayer insulating layer 161, and the upper interlayer insulating layer 162 may be formed by cutting the lower structure 10 and 20, the upper structure 40 and 50, the lower interlayer insulating layer 161, and the upper interlayer insulating layer 162. The lower sacrificial layers 10 and the upper sacrificial layers 40 exposed through the opening may be removed through a wet etching process that applies an etchant with an etch selectivity to a nitride. Through the wet etching process, the additional lower sacrificial layer patterns 31 and the additional upper sacrificial layer patterns 61 may also be removed. Opening regions OA may be formed by removing the lower sacrificial layer patterns 10, the upper sacrificial layer patterns 40, the additional lower sacrificial layer patterns 31, and the additional upper sacrificial layer patterns 61. Each of the opening regions OA may include a first region Z1 and a second region Z2. The first region Z1 and the second region Z2 are connected to each other, and the second region Z2 may be disposed in the pad region. At least one of the opening regions OA may be formed as an R-type region ZR in which the second region Z2 is thicker than the first region Z1. Alternatively, at least one of the opening regions OA may be formed as a P-type region ZP in which the second region Z2 has the same thickness as the first region Z1. The P-type region ZP may be formed by removing a sacrificial layer pattern in which an additional sacrificial layer pattern may not be formed. In an embodiment, the P-type region ZP may be formed by removing the uppermost lower sacrificial layer 11 (see FIG. 24), the lowermost lower sacrificial layer 16 (see FIG. 24), and the uppermost upper sacrificial layer pattern 41 (see FIG. 24).

Figure 26:
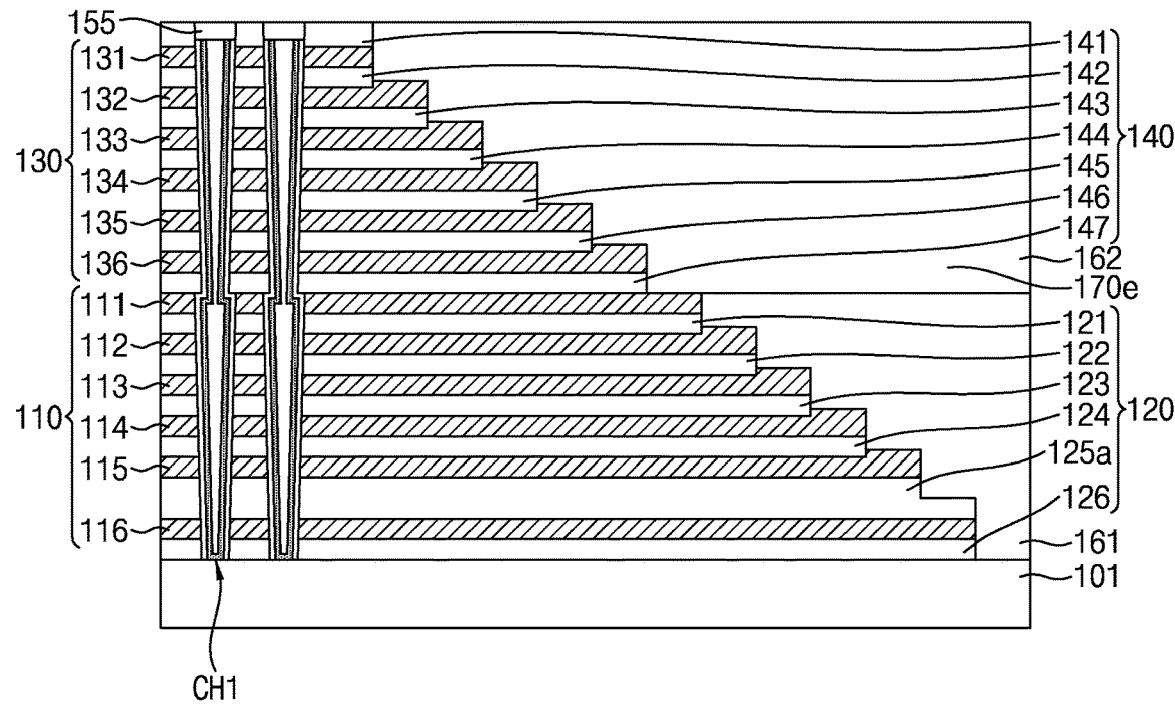

Referring to FIG. 26, the opening regions OA are filled with conductive materials through the opening such that gate electrodes 110 and 130 and gate pads P and R may be formed. The gate electrodes 110 and 130 may be formed in first regions Z1 of the opening regions OA, and the gate pads P and R may be formed in second regions Z2 of the opening regions OA. The gate electrodes 110 and 130 and the gate pads P and R may be formed in succession. Among the gate pads P and R, the gate pad formed in the R-type region ZR may be an R-type pad R that is thicker than the gate electrodes. Among the gate pads, the gate pad formed in the P-type region ZP may be a P-type pad P having the same thickness as the gate electrodes.

Figure 27:
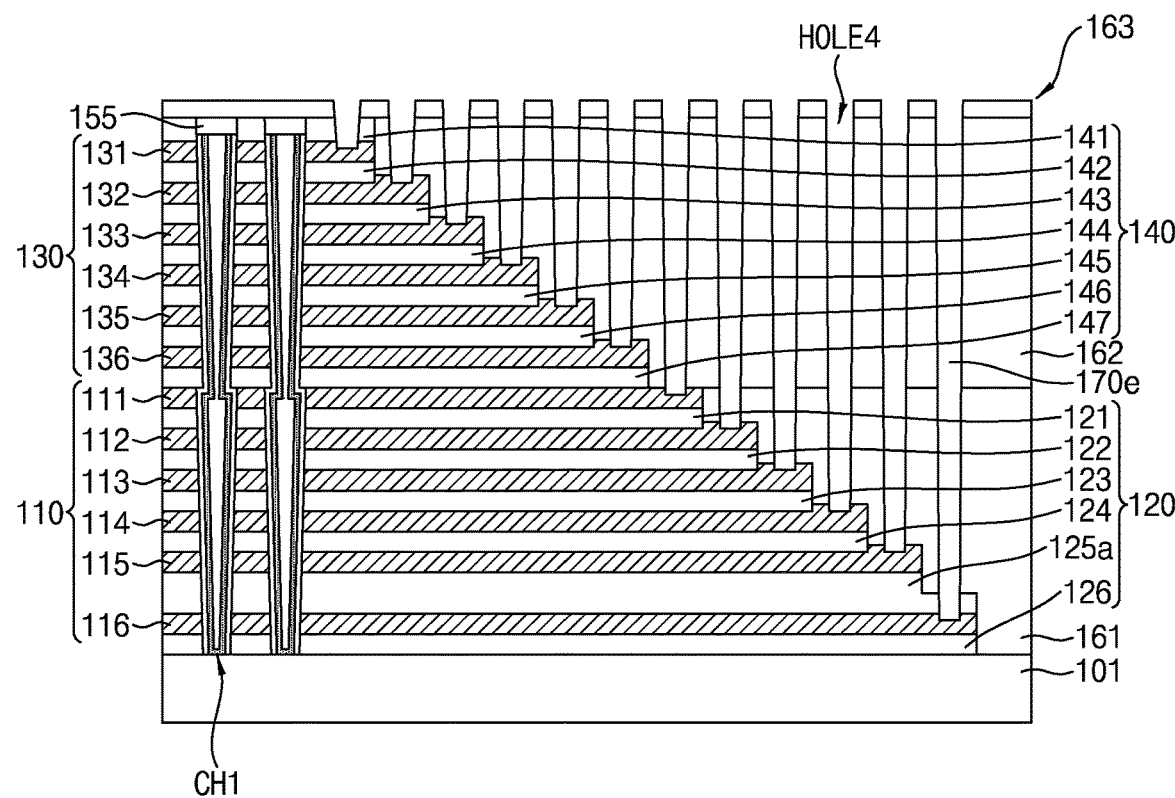

Referring to FIG. 27, an uppermost interlayer insulating layer 163 may be formed, and then contact holes HOLE4 may be formed. The contact holes HOLE4 may pass through the uppermost interlayer insulating layer 163 and the upper interlayer insulating layer 162. Some of the contact holes HOLE4 may pass through the uppermost interlayer insulating layer 163, the upper interlayer insulating layer 162, and the lower interlayer insulating layer 161. The contact holes HOLE4 may be recessed to a certain depth from a top surface of at least some regions of the gate pads P and R. In an embodiment, while a process of forming the contact holes HOLE4 is performed, the R-type pad R may provide a larger margin than the P-type pad P. In this case, the contact holes HOLE4 may be formed without passing through the R-type pad R. In an embodiment, while a process of forming the contact holes HOLE4 is performed, the P-type pad P may provide a smaller margin than the R-type pad R. In this case, the contact holes HOLE4 may be formed through the P-type pad P, but the disclosure is not limited thereto.

Figure 28:
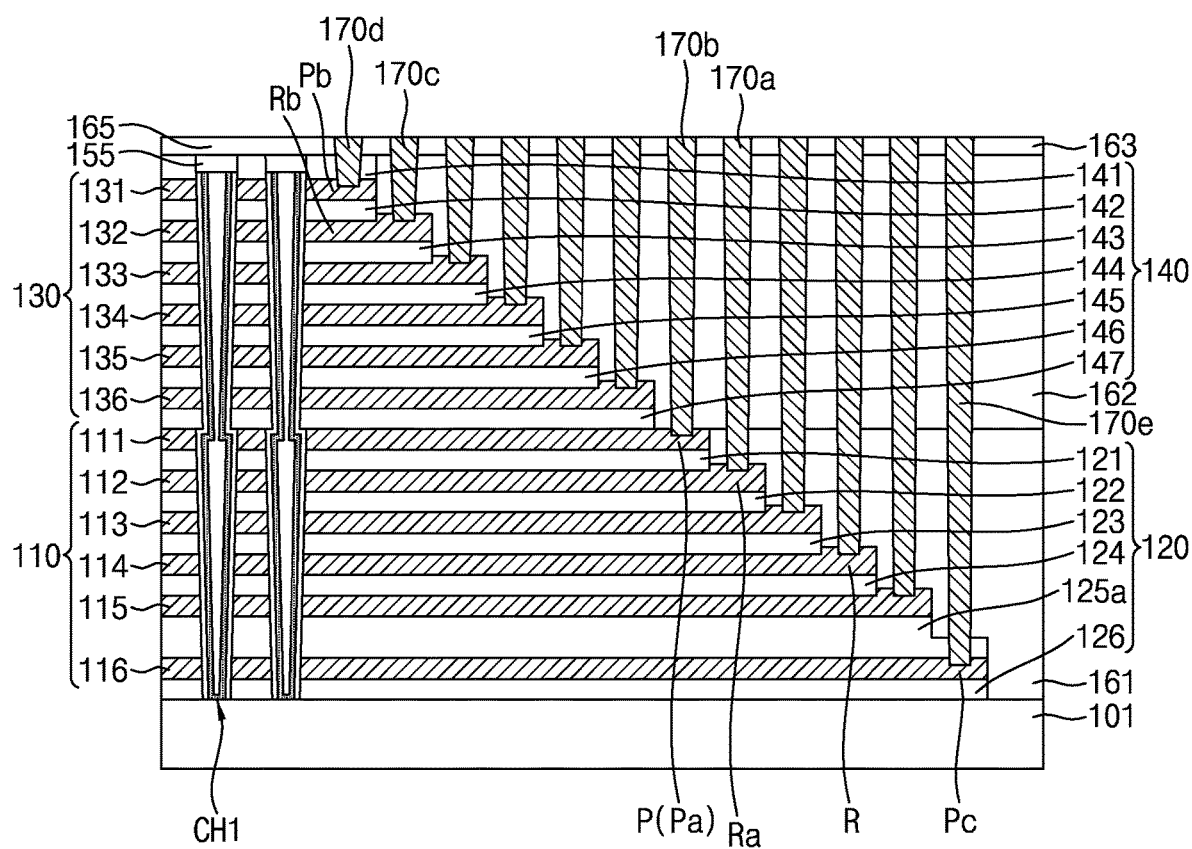

Referring to FIG. 28, the contact holes HOLE4 may be filled with conductive materials such as metals to form contacts 170. Some of the contacts 170 may be connected to two or more gate electrodes through the gate pads (see FIG. 7). For example, some of the contacts 170 may be connected, through a P-type pad P having a relatively small margin, to a gate electrode placed under the P-type pad P.

Referring to FIGS. 1 and 8 again, wires 180 to be electrically connected to the contacts 170 may be formed. The wires 180 may be connected to the contacts 170 to extend in the second direction. The wires 180 may include a coupling wire 180a that is commonly connected to at least two or more contacts. The coupling wire 180a may be commonly connected to a contact 170 connected to the P-type pad P and a contact connected to the R-type pad R placed under the P-type pad P. The coupling wire 180a may prevent a problem in which the contact 170 connected to the P-type pad P is electrically connected to a gate pad placed under the P-type pad P through the P-type pad P.

According to the example embodiments, it is possible to prevent malfunctions from occurring due to the punching phenomenon of a gate pad in a semiconductor device of a single-stack, dual-stack, or multi-stack structure.

Also, it is possible to improve the overall process efficiency during a process of forming a gate pad that is thicker than a gate electrode by not applying the thick gate pad to a certain region.

Embodiments of the technical spirit of the inventive concepts have been described above with reference to the accompanying drawings. However, it will be understood by those skilled in the art that various changes in form and details may be made therein without departing from the spirit and scope of the invention as defined by the appended claims. Therefore, the above embodiments are to be regarded as illustrative rather than restrictive.

What is claimed is:

1. A method of manufacturing a semiconductor device comprising:

forming a structure having insulating layers and sacrificial layers alternately repeatedly stacked on a substrate and having a step-shaped structure at one side;

forming additional sacrificial layer patterns disposed on the one side of the structure;

forming a lower interlayer insulating layer and an upper interlayer insulating layer on the additional sacrificial layer patterns;

removing some of the additional sacrificial layer patterns;

forming a channel structure passing through the structure;

removing the sacrificial layers and the additional sacrificial layer patterns to form an open area;

forming gate electrodes and gate pads filling the open area; and forming a contact passing through at least one of the lower interlayer insulating layer and the upper interlayer insulating layer and connected to the gate pads, wherein the gate pads extend from one end of the gate electrodes, and comprise a thick pad having a thickness thicker than that of the gate electrodes and a thin pad having the same thickness as that of the gate electrodes, and wherein a side surface of the thick pad contacts a side surface of an insulating layer above the gate electrode from which the thick pad extends.

2. The method of claim 1, wherein the thin pad comprises:
a lowermost pad connected to a lowermost gate electrode of the gate electrodes; and
an uppermost pad connected to an uppermost gate electrode of the gate electrodes.

3. The method of claim 1,
wherein the forming of the structure comprises:
forming a lower structure comprising a stepwise portion; and
forming an upper structure comprising a stepwise portion on the lower structure,
wherein the forming of the additional sacrificial layer patterns comprises:
forming additional lower sacrificial layer patterns covering an upper surface and the stepwise portion of the lower structure; and
forming additional upper sacrificial layer patterns covering an upper surface and the stepwise portion of the upper structure,
wherein the removing of the some of the additional sacrificial layer patterns comprises:
removing the additional lower sacrificial layer pattern covering the upper surface of the lower structure among the additional lower sacrificial layer patterns to expose an upper surface of an uppermost lower sacrificial layer of the lower structure.

4. The method of claim 3, wherein the forming of the upper structure comprises:
forming a lowermost upper insulating layer and a lowermost upper sacrificial layer covering the upper surface of the uppermost lower sacrificial layer of the lower structure and an upper surface of the lower interlayer insulating layer; and
removing a portion of the lowermost upper sacrificial layer and the lowermost upper insulating layer to expose a portion of an upper surface of the uppermost lower sacrificial layer of the lower structure and the upper surface of the lower interlayer insulating layer.

5. The method of claim 3, wherein the forming of the lower structure comprising the stepwise portion further comprises:

forming a thick lower insulating layer that is relatively thicker than other lower insulating layers,
wherein the thick lower insulating layer comprises a stepwise portion on one side, and
wherein the stepwise portion of the lower structure comprises a stepwise portion of the thick lower insulating layer.

6. The method of claim 5, wherein the thick lower insulating layer covers an upper surface of the lowermost gate electrode and an upper surface of the lowermost pad.

7. The method of claim 5, wherein the channel structure comprises an epitaxial pattern connected to the substrate, an information storage pattern, a channel pattern, a core pattern, and a conductive pad on the epitaxial pattern.

8. The method of claim 7, wherein an upper end of the epitaxial pattern locates a level lower than an upper surface of the thick lower insulating layer.

9. The method of claim 7, wherein the contact is connected to the lowest pad through the thick lower insulating layer.

10. The method of claim 3, wherein the removing of the some of the additional sacrificial layer patterns further comprises:
removing an additional lower sacrificial layer pattern covering the upper surface of an upper structure among the additional upper sacrificial layer patterns using a planarization process to expose the upper surface of the upper structure and the upper surface of the upper interlayer insulating layer.

11. A method of manufacturing a semiconductor device comprising:
forming a structure having insulating layers and sacrificial layers alternately repeatedly stacked on a substrate and having a step-shaped structure at one side;
forming additional sacrificial layer patterns disposed on the one side of the structure;
forming a lower interlayer insulating layer and an upper interlayer insulating layer on the additional sacrificial layer patterns;
removing some of the additional sacrificial layer patterns;
forming a channel structure passing through the structure;
removing the sacrificial layers and the additional sacrificial layer patterns to form an open area;
forming gate electrodes and gate pads filling the open area; and
forming a contact passing through at least one of the lower interlayer insulating layer and the upper interlayer insulating layer and connected to the gate pads,
wherein the gate pads extend from one end of the gate electrodes, and comprise a thick pad having a thickness thicker than that of the gate electrodes and a thin pad having the same thickness as that of the gate electrodes, and
wherein the thin pad comprises:
a lowermost pad connected to a lowermost gate electrode of the gate electrodes; and
an uppermost pad connected to an uppermost gate electrode of the gate electrodes.

12. A method of manufacturing a semiconductor device comprising:
forming a structure having insulating layers and sacrificial layers alternately repeatedly stacked on a substrate and having a step-shaped structure at one side;
forming additional sacrificial layer patterns disposed on the one side of the structure;
forming a lower interlayer insulating layer and an upper interlayer insulating layer on the additional sacrificial layer patterns;
removing some of the additional sacrificial layer patterns;
forming a channel structure passing through the structure;
removing the sacrificial layers and the additional sacrificial layer patterns to form an open area;
forming gate electrodes and gate pads filling the open area; and
forming a contact passing through at least one of the lower interlayer insulating layer and the upper interlayer insulating layer and connected to the gate pads,
wherein the gate pads extend from one end of the gate electrodes, and comprise a thick pad having a thickness thicker than that of the gate electrodes and a thin pad having the same thickness as that of the gate electrodes,
wherein the forming of the structure comprises:
forming a lower structure comprising a stepwise portion; and
forming an upper structure comprising a stepwise portion on the lower structure,
wherein the forming of the additional sacrificial layer patterns comprises:
forming additional lower sacrificial layer patterns covering an upper surface and the stepwise portion of the lower structure; and
forming additional upper sacrificial layer patterns covering an upper surface and the stepwise portion of the upper structure, and
wherein the removing of the some of the additional sacrificial layer patterns comprises:
removing the additional lower sacrificial layer pattern covering the upper surface of the lower structure among the additional lower sacrificial layer patterns to expose an upper surface of an uppermost lower sacrificial layer of the lower structure.

13. The method of claim 12, wherein the forming of the upper structure comprises:
forming a lowermost upper insulating layer and a lowermost upper sacrificial layer covering the upper surface of the uppermost lower sacrificial layer of the lower structure and an upper surface of the lower interlayer insulating layer; and
removing a portion of the lowermost upper sacrificial layer and the lowermost upper insulating layer to expose a portion of an upper surface of the uppermost lower sacrificial layer of the lower structure and the upper surface of the lower interlayer insulating layer.

14. The method of claim 12, wherein the forming of the lower structure further comprising the stepwise portion comprises:
forming a thick lower insulating layer that is relatively thicker than other lower insulating layers,
wherein the thick lower insulating layer comprises a stepwise portion on one side, and
wherein the stepwise portion of the lower structure comprises a stepwise portion of the thick lower insulating layer.

15. The method of claim 14, wherein the thick lower insulating layer covers an upper surface of the lowermost gate electrode and an upper surface of the lowermost pad.

16. The method of claim 14, wherein the channel structure comprises an epitaxial pattern connected to the substrate, an information storage pattern, a channel pattern, a core pattern, and a conductive pad on the epitaxial pattern.

17. The method of claim 16, wherein an upper end of the epitaxial pattern locates a level lower than an upper surface of the thick lower insulating layer.

18. The method of claim 16, wherein the contact is connected to the lowest pad through the thick lower insulating layer.

19. The method of claim 12, wherein the removing of the some of the additional sacrificial layer patterns further comprises:

removing an additional lower sacrificial layer pattern covering the upper surface of an upper structure among the additional upper sacrificial layer patterns using a planarization process to expose the upper surface of the upper structure and the upper surface of the upper interlayer insulating layer.

\* \* \* \* \*